US012622079B2

(12) United States Patent
Miyata et al.

(10) Patent No.: US 12,622,079 B2
(45) Date of Patent: May 5, 2026

(54) OPTICAL ELEMENT, IMAGE SENSOR AND IMAGING DEVICE FOR WAVWLENGTH-DEPENDENT FOCUSING OF VISIBLE AND NEAR-INFRARED LIGHT

(71) Applicant: NTT, Inc., Tokyo (JP)

(72) Inventors: Masashi Miyata, Musashino (JP); Naru Nemoto, Musashino (JP); Fumihide Kobayashi, Musashino (JP); Toshikazu Hashimoto, Musashino (JP)

(73) Assignee: NTT, Inc., Tokyo (JP)

( * ) Notice: Subject to any disclaimer, the term of this patent is extended or adjusted under 35 U.S.C. 154(b) by 348 days.

(21) Appl. No.: 18/039,040

(22) PCT Filed: Nov. 30, 2020

(86) PCT No.: PCT/JP2020/044561
§ 371 (c)(1),
(2) Date: May 26, 2023

(87) PCT Pub. No.: WO2022/113363
PCT Pub. Date: Jun. 2, 2022

(65) Prior Publication Data
US 2024/0014237 A1      Jan. 11, 2024

(51) Int. Cl.
*H10F 39/00*          (2025.01)
*G02B 5/20*           (2006.01)

(52) U.S. Cl.
CPC ........... *H10F 39/806* (2025.01); *G02B 5/208* (2013.01)

(58) Field of Classification Search
CPC .... H10F 39/806; H10F 39/182; H10F 39/199; H10F 39/8053; H10F 39/802; G02B 5/20; G02B 5/208; G02B 5/201; H04N 23/11
(Continued)

(56) References Cited

U.S. PATENT DOCUMENTS

| | | | |
|---|---|---|---|
| 10,886,321 B2 | 1/2021 | Miyata et al. | |
| 2014/0091419 A1* | 4/2014 | Hasegawa | G02B 13/005 |
| | | | 359/359 |

(Continued)

FOREIGN PATENT DOCUMENTS

| | | |
|---|---|---|
| CN | 111095561 A | 5/2020 |
| EP | 3812801 A1 | 4/2021 |

(Continued)

OTHER PUBLICATIONS

Kudo et al., "Pigmented Photoresists for Color Filters," Journal of Photopolymer Science and Technology, 1996, 9(1):109-119.
(Continued)

*Primary Examiner* — Didarul A Mazumder
(74) *Attorney, Agent, or Firm* — Fish & Richardson P.C.

(57)          ABSTRACT
An optical element includes a transparent layer for covering a plurality of pixels each including a photoelectric conversion element, and a plurality of structure bodies arranged on the transparent layer or in the transparent layer in a plane direction of the transparent layer. The plurality of structure bodies is arranged in such a manner that, among incident light, first light having a wavelength in a near-infrared light region is condensed on a first pixel among the plurality of pixels, and light of a second color having a wavelength in a region outside the near-infrared light region is condensed on a second pixel.

8 Claims, 32 Drawing Sheets

(58) Field of Classification Search
USPC ...................................... 257/432; 438/48, 65
See application file for complete search history.

(56) References Cited

U.S. PATENT DOCUMENTS

| | | | |
|---|---|---|---|
| 2017/0090206 A1* | 3/2017 | Kim ...................... | H10F 39/806 |
| 2019/0006406 A1 | 1/2019 | Ozawa | |
| 2019/0297278 A1* | 9/2019 | Sumi ...................... | H10F 39/12 |
| 2020/0083269 A1 | 3/2020 | Ozawa | |
| 2020/0266230 A1* | 8/2020 | Miyata ................ | H10F 39/8067 |
| 2020/0343286 A1 | 10/2020 | Ozawa | |
| 2020/0363576 A1* | 11/2020 | Yamada ................ | C09B 23/107 |
| 2021/0082988 A1 | 3/2021 | Miyata et al. | |
| 2021/0366961 A1* | 11/2021 | Yanagita ............. | H10F 39/8033 |
| 2023/0119792 A1 | 4/2023 | Miyata et al. | |
| 2024/0222414 A1 | 7/2024 | Miyata et al. | |

FOREIGN PATENT DOCUMENTS

| | | |
|---|---|---|
| JP | 2017139286 | 8/2017 |
| JP | 2019184986 | 10/2019 |
| KR | 20200029572 | 3/2020 |
| WO | WO 2018225367 | 12/2018 |

OTHER PUBLICATIONS

Yusuke et al., "Single-Sensor RGB-NIR Imaging: High-Quality System Design and Prototype Implementation," IEEE Sensors Journal, 2018, 19(2):497-507.

* cited by examiner

Fig. 16

| R | G |
|---|---|
| NIR | B |

Designed pattern

OPTICAL ELEMENT, IMAGE SENSOR AND IMAGING DEVICE FOR WAVWLENGTH-DEPENDENT FOCUSING OF VISIBLE AND NEAR-INFRARED LIGHT

CROSS-REFERENCE TO RELATED APPLICATIONS

This application is a National Stage application under 35 U.S.C. § 371 of International Application No. PCT/JP2020/044561, having an International Filing Date of Nov. 30, 2020.

The disclosure of the prior application is considered part of the disclosure of this application, and is incorporated by reference in its entirety into this application.

TECHNICAL FIELD

The present invention relates to an optical element, an imaging element, and an imaging device.

BACKGROUND ART

A general imaging device uses a lens optical system and a two-dimensional imaging element such as a charge coupled device (CCD) sensor or a complementary metal oxide semiconductor (CMOS) sensor to acquire a two-dimensional image including intensity information and color information of light from an imaging target.

In recent years, there is an increasing demand for simultaneous imaging of images of near-infrared (NIR) light in addition to visible light (color information). Since the near-infrared imaging device can capture images at night, the near-infrared imaging device has attracted attention for applications such as in-vehicle cameras and monitoring cameras.

Accordingly, as an imaging element that captures both color information of visible light and a near-infrared image, a configuration has been proposed in which four types of color filters obtained by adding NIR to red (R), green (G), and blue (B) are integrated on each pixel in order to acquire color information and NIR information.

CITATION LIST

Non Patent Literature

Non Patent Literature 1: Takanori Kudo, Yuki Nanjo, Yuko Nozaki, Kazuya Nagao, Hidemasa Yamaguchi, Wen-Bing Kang, Georg Pawlowski, "PIGMENTED PHOTORESISTS FOR COLOR FILTERS", Journal of Photopolymer Science and Technology, 1996, Vol. 9, No. 1, p. 109-119.

Non Patent Literature 2: Monno, Yusuke, et al. "Single-Sensor RGB-NIR Imaging: High-Quality System Design and Prototype Implementation". IEEE Sensors Journal 19.2 (2018):497-507.

SUMMARY OF INVENTION

Technical Problem

However, in the conventional imaging element, there is a problem that the total amount of received light after filter transmission decreases due to absorption of light outside the transmission wavelength band by the color filter, and sensitivity is limited. Then, since a general color filter partially transmits light in the NIR wavelength region, in the conventional imaging element, in order to generate a color image, it is necessary to perform color calibration such as subtracting the NIR pixel value from the R, G, and B pixel values.

The present invention has been made in view of the above, and an object of the present invention is to provide an optical element, an imaging element, and an imaging device capable of improving light receiving sensitivity with visible light and near-infrared light of incident light without causing light absorption.

Solution to Problem

In order to solve the above-described problem and achieve the object, an optical element according to the present invention includes a transparent layer for covering a plurality of pixels each including a photoelectric conversion element, and a plurality of structure bodies arranged on the transparent layer or in the transparent layer in a plane direction of the transparent layer, in which the plurality of structure bodies is arranged in such a manner that, among incident light, first light having a wavelength in a near-infrared light region is condensed on a first pixel among the plurality of pixels, and light of a second color having a wavelength in a region outside the near-infrared light region is condensed on a second pixel.

Further, an optical element according to the present invention includes a transparent layer for covering a plurality of pixels each including a photoelectric conversion element, and a plurality of structure bodies arranged on the transparent layer or in the transparent layer in a plane direction of the transparent layer, in which the plurality of structure bodies outputs first light that is a wavelength in a near-infrared light region among incident light, and outputs light of a second color having a wavelength in a region outside the near-infrared light region among the incident light.

Further, an imaging element according to the present invention includes the above-described optical element, and the plurality of pixels covered with the transparent layer.

Further, an imaging device according to the present invention includes the above-described imaging element, and a signal processing unit configured to generate an image signal on a basis of an electric signal obtained from the imaging element.

Advantageous Effects of Invention

According to the present invention, light receiving sensitivity with visible light of incident light can be improved without causing light absorption.

BRIEF DESCRIPTION OF DRAWINGS

FIG. 16 is a view schematically illustrating a pixel arrangement of a pixel unit.

DESCRIPTION OF EMBODIMENTS

Figure 1:
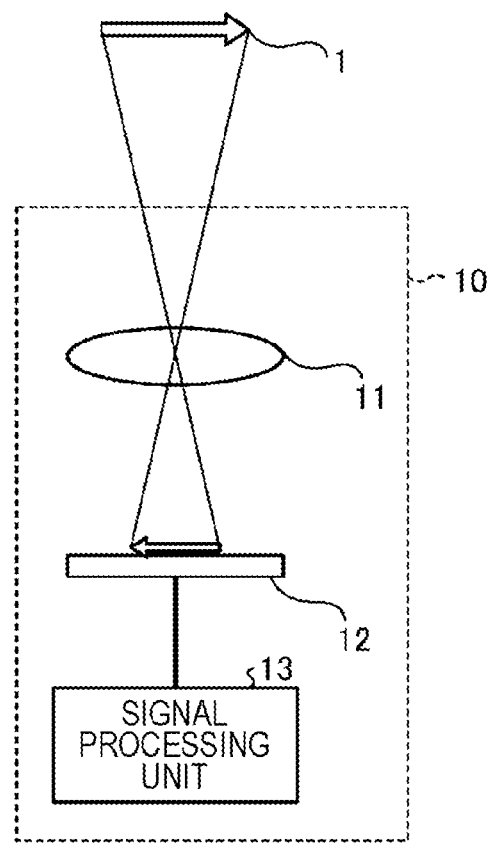
FIG. 1 is a side view illustrating a schematic configuration of an imaging device according to a first embodiment.

Hereinafter, best modes for carrying out the present invention will be described in detail with reference to the drawings. Note that, in the following description, each drawing merely schematically illustrates a shape, a size, and a positional relationship to such an extent that the contents of the present invention can be understood, and therefore the present invention is not limited only to the shape, the size, and the positional relationship exemplified in the drawings. Further, in the description of the drawings, the same portions are denoted by the same reference signs.

First Embodiment

[Imaging Device]

First, an imaging device according to a first embodiment of the present invention will be described. FIG. 1 is a side view illustrating a schematic configuration of an imaging device according to the first embodiment.

As illustrated in FIG. 1, an imaging device 10 according to the first embodiment includes a lens optical system 11, an imaging element 12, and a signal processing unit 13. The lens optical system 11 includes a photoelectric conversion element such as a CCD or a CMOS. The signal processing unit 13 processes a photoelectric conversion signal output from the imaging element 12 to generate an image signal.

The object 1 is irradiated with light such as natural light or illumination light, and light transmitted/reflected/scattered by the object 1 or light emitted from the object 1 forms an optical image on the imaging element 12 by the lens optical system 11. In general, the lens optical system 11 includes a lens group including a plurality of lenses arranged along an optical axis in order to correct various optical aberrations, but in FIG. 1, the drawing is simplified and illustrated as a single lens. The signal processing unit 13 has an image signal output for transmitting the generated image signal to the outside.

Note that the imaging device 10 may include known components such as an infrared cut optical filter, an electronic shutter, a viewfinder, a power supply (battery), and a flash light, but the description thereof is not particularly necessary for understanding the present invention and thus will be omitted. Further, the above configuration is merely an example, and in the first embodiment, known elements can be appropriately combined and used as components excluding the lens optical system 11, the imaging element 12, and the signal processing unit 13.

[Imaging Element]

Next, an outline of the imaging element 12 according to the first embodiment will be described. The imaging element 12 according to the first embodiment includes a pixel array in which a plurality of pixels including photoelectric conversion elements is arranged in a two-dimensional array, and an optical element array (optical element) in which a plurality of fine structure bodies having a wavelength separation function and a light condensing function for each pixel is arranged on the entire surface. Note that, hereinafter, a part of the imaging element 12 will be described as an imaging element 100.

Figure 2:
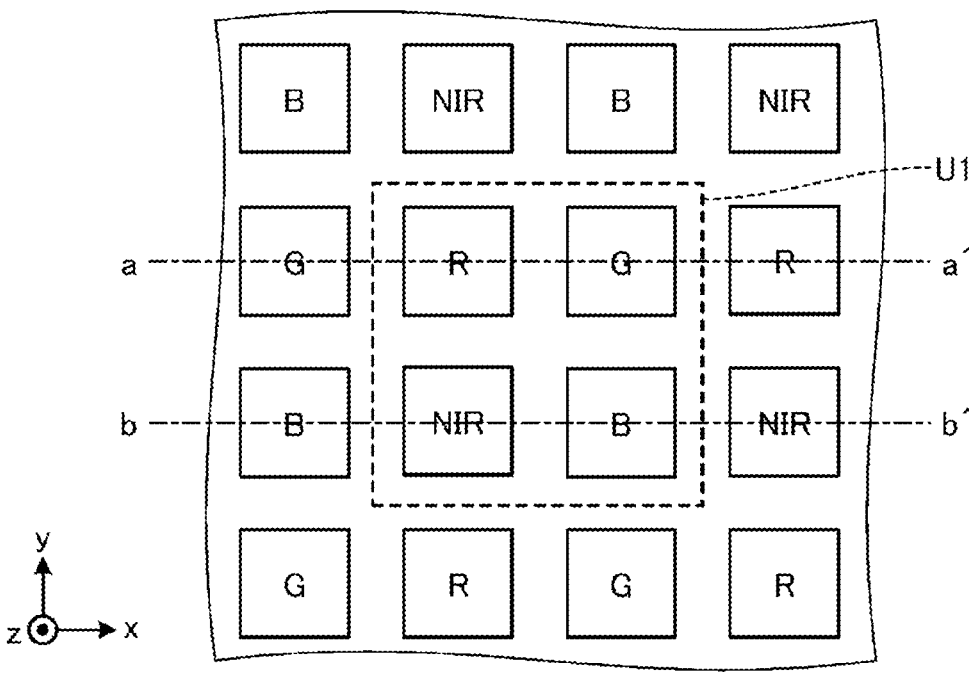
FIG. 2 is a view schematically illustrating a pixel arrangement of a pixel array in plan view of an imaging element.
Figure 3:
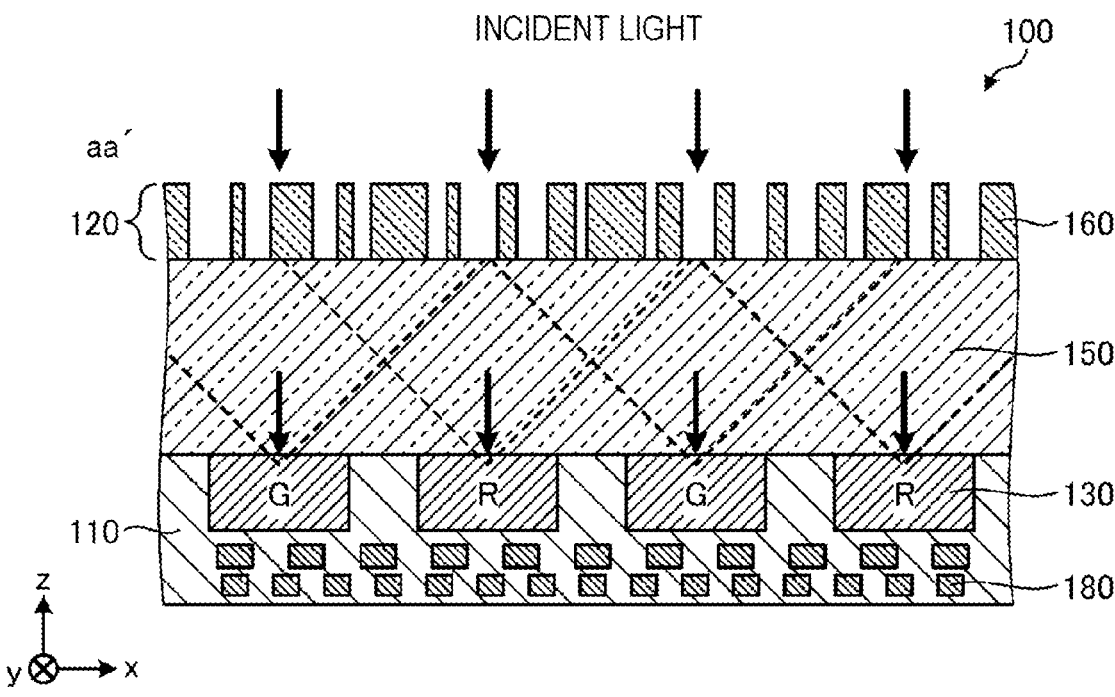
FIG. 3 is a view illustrating an example of a cross section of the imaging element in side view along line a-a' of FIG. 2.
Figure 4:
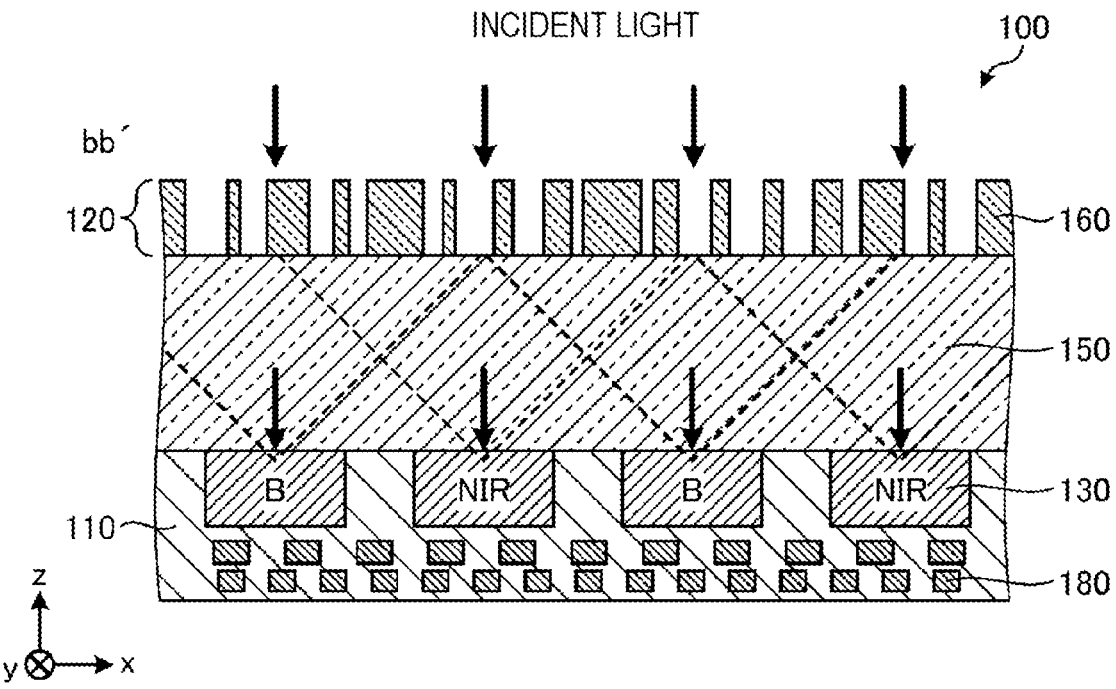
FIG. 4 is a view illustrating an example of a cross section of the imaging element in side view along line b-b' in FIG. 2.
Figure 5:
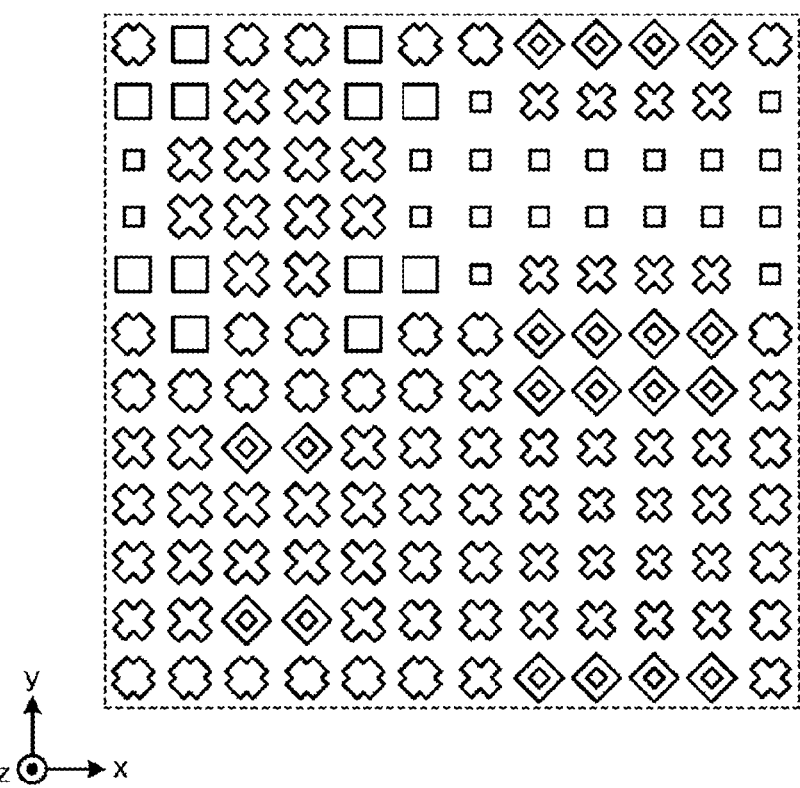
FIG. 5 is a plan view illustrating an example of shapes and an arrangement of structure bodies in an optical element array illustrated in FIG. 2 in plan view.
Figure 6:
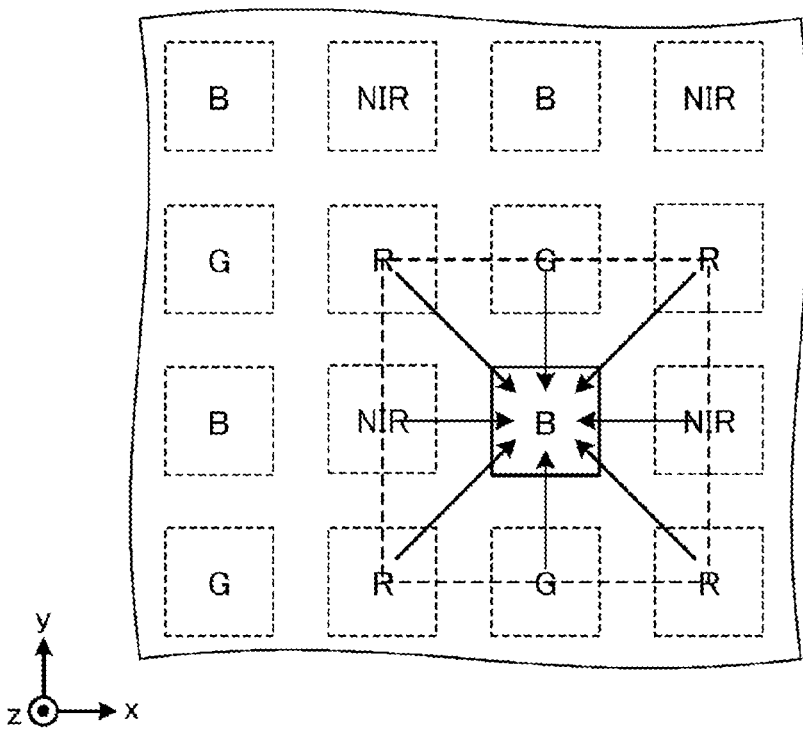
FIG. 6 is a view schematically illustrating light condensing on a pixel in the imaging element.

FIG. 2 is a view schematically illustrating a pixel arrangement of a pixel array in a plan view of the imaging element. FIG. 3 is a view illustrating an example of a cross section of the imaging element 100 in side view along line a-a' of FIG. 2. FIG. 4 is a view illustrating an example of a cross section of the imaging element 100 in side view along line b-b' of FIG. 2. Note that, in FIGS. 3 and 4, arrows schematically indicate light incident on the imaging element 100. FIG. 5 is a plan view illustrating an example of shapes and an arrangement of structure bodies in the optical element array illustrated in FIG. 2 in plan view. In the drawings, an xyz coordinate system is illustrated. An xy plane direction corresponds to a plane direction of a pixel array 110, a transparent layer 150, and the like described later. Hereinafter, unless otherwise specified, "plan view" indicates viewing in a z-axis direction (for example, in a z-axis negative direction). "Side view" indicates viewing in an x-axis direction or a y-axis direction (for example, a y-axis negative direction).

As illustrated in FIGS. 3 and 4, the imaging element 100 includes a pixel array 110 and an optical element array 120 arranged to face the pixel array 110. The pixel array 110 and the optical element array 120 are provided in this order in the z-axis positive direction.

As illustrated in FIGS. 2 to 4, the optical element array 120 is arranged on a side on which light from the lens optical system 11 is incident. The optical element array 120 is formed on an upper surface of the transparent layer 150 formed on the pixel array 110. Note that the transparent layer 150 is a transparent layer having a low refractive index formed by a material such as $SiO_2$ (refractive index n=1.45).

The pixel array 110 includes a wiring layer 180 and a plurality of pixels 130 arranged in the xy plane direction. Each pixel 130 includes a photoelectric conversion element. An example of the photoelectric conversion element is a photodiode (PD). Each pixel corresponds to red (R), green (G), blue (B), and near infrared (NIR). An example of the wavelength band of red light is 600 nm$<\lambda_0\leq$800 nm when the wavelength is $\lambda_0$. An example of the wavelength band of green light is 500 nm$<\lambda_0\leq$600 nm. An example of the wavelength band of blue light is $\lambda_0\leq$500 nm. An example of the wavelength band of the near-infrared light is 800 to 1000 nm. Each pixel is referred to as a pixel R, a pixel G, a pixel B, and a pixel NIR so as to be distinguishable. These four pixels R, G, B, and NIR are arranged in a Bayer array as illustrated in FIG. 2 to constitute one pixel unit U1.

The incident light travels along the z-axis negative direction and reaches the pixel array 110 via the optical element array 120. The optical element array 120 condenses red light on the pixel R, condenses green light on the pixel G, condenses blue light on the pixel B, and condenses near-infrared light on the pixel NIR among the incident light. Charges generated in the pixel R, the pixel G, the pixel B, and the pixel NIR are converted into an electric signal to be a basis of a pixel signal by a transistor or the like which is not illustrated, and are output to the outside of the imaging element 100 via the wiring layer 180. In FIGS. 3 and 4, some of wirings included in the wiring layer 180 are illustrated.

The optical element array 120 is provided so as to cover the pixel array 110. An example of the optical element array 120 is a meta-surface. The meta-surface includes a plurality of fine structure bodies (corresponding to the structure body 160) having a width equal to or less than a wavelength of light. The meta-surface may have either a two-dimensional structure or a three-dimensional structure. The optical element array 120 can control the phase and the light intensity according to light characteristics (wavelength, polarization, and incident angle) only by changing parameters of the structure body 160. In a case of the three-dimensional structure, the degree of freedom in design is improved as compared with the two-dimensional structure.

The optical element array 120 has two functions of a wavelength separation function and a lens function. The wavelength separation function is a function of separating incident light into light of each wavelength band. The lens function is a function of condensing light of each wavelength to a corresponding pixel. In this example, the incident light is separated into red light, green light, blue light, and NIR light by the wavelength separation function of the optical element array 120. By the lens function, the red light is condensed on the pixel R, the green light is condensed on the pixel G, the blue light is condensed on the pixel B, and the NIR light is condensed on the pixel NIR.

The optical element array 120 includes a transparent layer 150 and a plurality of structure bodies 160. The transparent layer 150 is provided on the pixel array 110 so as to cover the pixel array 110. The transparent layer 150 has a refractive index lower than the refractive index of the structure bodies 160. An example of the material of the transparent layer 150 is $SiO_2$ or the like. The transparent layer 150 may be a void, and in this case, the refractive index of the transparent layer 150 may be equal to the refractive index of air. The material of the transparent layer 150 may be a single material or a plurality of layered materials.

The plurality of structure bodies 160 is arranged on the transparent layer 150 or in the transparent layer 150 in a plane direction (xy plane direction) of the transparent layer 150, for example, periodically (with a periodic structure). In this example, the structure bodies 160 are provided on the transparent layer 150 on the side (z-axis positive direction side) opposite to the pixel array 110 across the transparent layer 150. The plurality of structure bodies 160 may be arranged at equal intervals or may be arranged at unequal intervals for ease of design or the like. Each structure body 160 is a nano-ordered size fine structure having a dimension equal to or smaller than the wavelength of the incident light. The plurality of structure bodies 160 has the same height in side view.

FIG. 5 schematically illustrates an example of the shapes and arrangement of the plurality of structure bodies 160 in the region corresponding to the pixel unit U1 in FIG. 2 in plan view. The structure bodies 160 each have, for example, a square shape, a cross shape, or a circular shape in plan view. Each of the square-shaped, cross-shaped, and circular-shaped structure bodies 160 has the same basic shape and different dimensions (length, width, and the like). The shapes of the structure bodies 160 in plan view may be four-fold rotationally symmetrical shapes. Such a shape may include, for example, at least one of a square shape, a cross shape, or a circular shape. Each structure body 160 has a four-fold rotationally symmetrical shape in plan view, so that it has a characteristic independent of polarization.

In the example of FIG. 5, a square shape, an X shape obtained by rotating a cross shape in plane by 45°, and a hollow rhombus shape are illustrated as the shapes of the structure bodies 160 in plan view. Note that, the hollow rhombus shape is an example of a shape including a square shape, and is a shape obtained by rotating the hollow square shape in plane by 45°.

Note that, when a shape rotated in plane by 45° such as an X shape or a rhombus is employed, optical coupling between adjacent structure bodies is weakened, so that optical characteristics of each structure are easily maintained without being affected by adjacent structure bodies. Consequently, an ideal phase delay amount distribution described later can be easily reproduced.

FIGS. 6 to 9 are views schematically illustrating light condensing on a pixel in the imaging element 100. In the imaging element 100, the blue light is condensed on the pixel B as indicated by arrows in FIG. 6. In this example, not only the light above the pixel B (in the Z-axis positive direction) but also the light above the peripheral pixels of the pixel B is condensed on the pixel B. That is, the plurality of structure bodies 160 (FIGS. 3 to 5) is arranged so that the light of color corresponding to the pixel B among the light incident on the outside of a region facing the pixel B is also condensed on the pixel B. Thus, the amount of received light can be increased as compared with a case where only the light incident on the region facing the pixel B is condensed on the pixel B.

Figure 7:
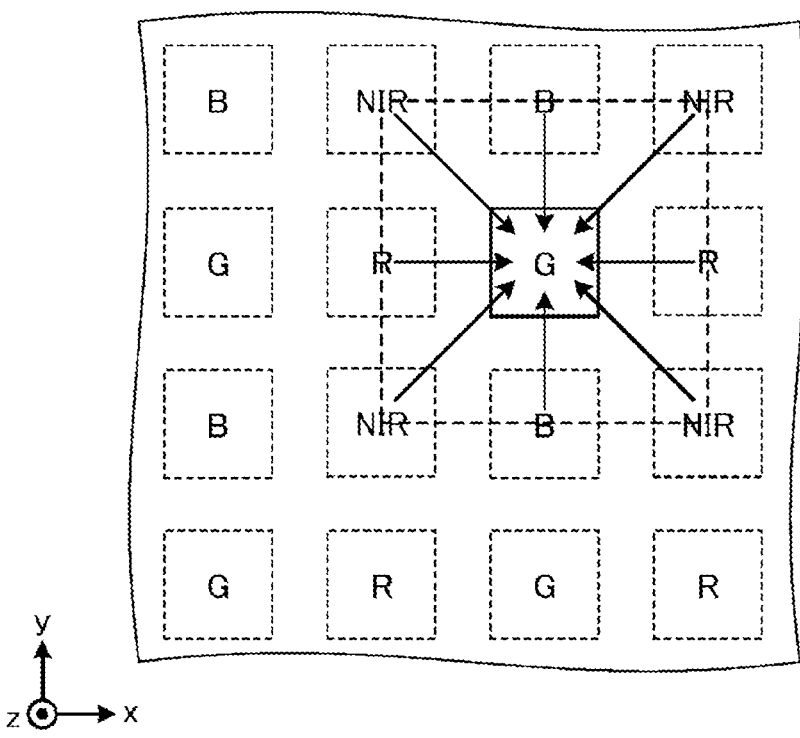
FIG. 7 is a view schematically illustrating light condensing on a pixel in the imaging element.

In the imaging element 100, the green light is condensed on the pixel G as indicated by arrows in FIG. 7. In this example, not only the light above the pixel G but also the light above the pixels around the pixel G is condensed on the pixel G. That is, the plurality of structure bodies 160 is arranged so that the light of color corresponding to the pixel G among the light incident on the outside of a region facing the pixel G is also condensed on the pixel G. Thus, the amount of received light can be increased as compared with a case where only the light incident on the region facing the pixel G is condensed on the pixel G.

Figure 8:
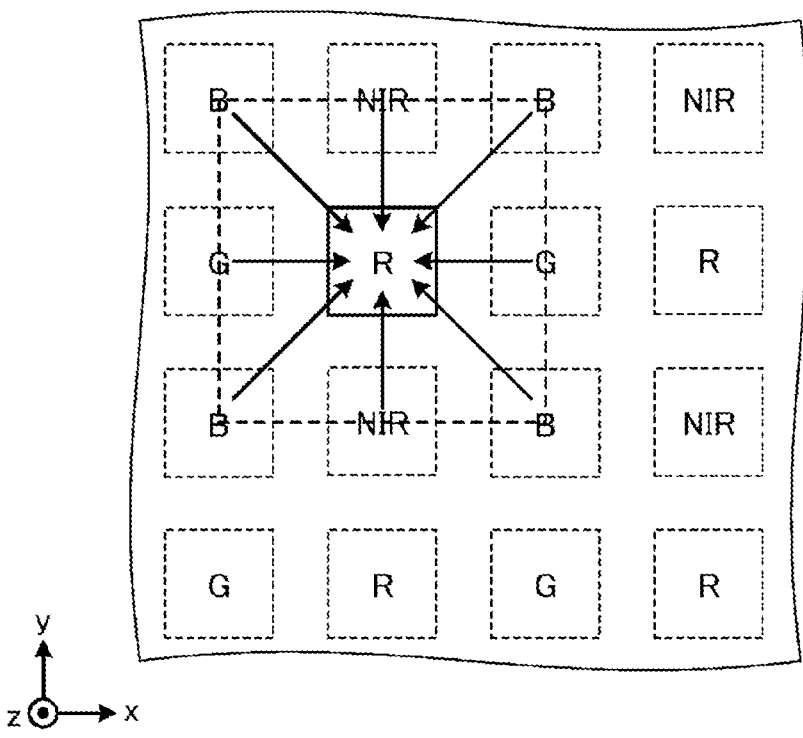
FIG. 8 is a view schematically illustrating light condensing on a pixel in the imaging element.

In the imaging element 100, the red light is condensed on the pixel R as indicated by arrows in FIG. 8. In this example, not only the light above the pixel R but also the light above the pixels around the pixel R is condensed on the pixel R. That is, the plurality of structure bodies 160 is arranged so that the light of color corresponding to the pixel R among the light incident on the outside of a region facing the pixel R is also condensed on the pixel R. Thus, the amount of received light can be increased as compared with a case where only the light incident on the region facing the pixel R is condensed on the pixel R.

Figure 9:
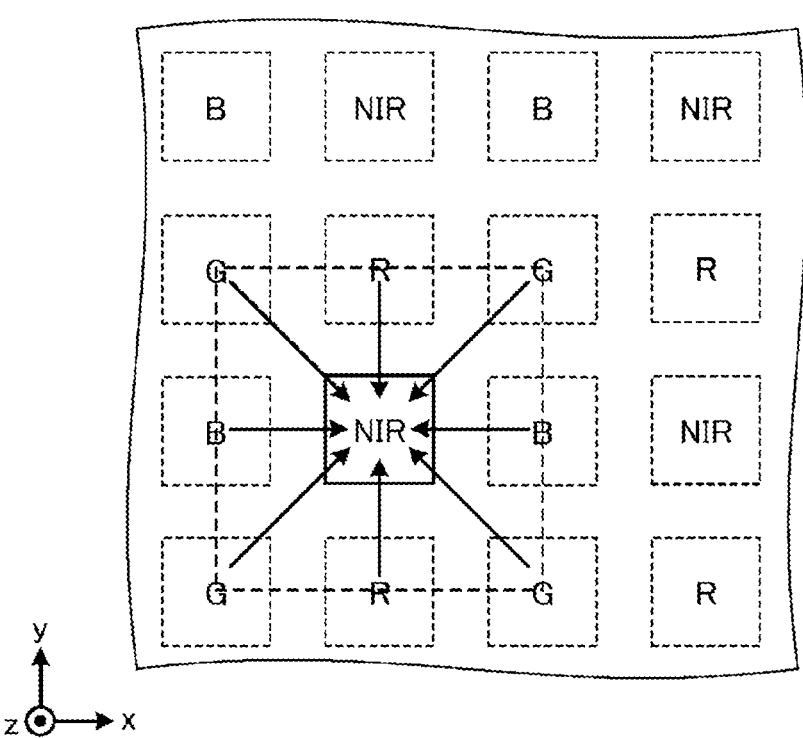
FIG. 9 is a view schematically illustrating light condensing on a pixel in the imaging element.

In the imaging element 100, the near-infrared light is condensed on the pixel NIR as indicated by arrows in FIG. 9. In this example, not only the light above the pixel NIR but also the light above the pixels around the pixel NIR is condensed on the pixel NIR. That is, the plurality of structure bodies 160 is arranged so that the light of color corresponding to the pixel NIR among the light incident on the outside of a region facing the pixel NIR is also condensed on the pixel NIR. Thus, the amount of received light can be increased as compared with a case where only the light incident on the region facing the pixel NIR is condensed on the pixel NIR.

As described above, the plurality of structure bodies 160 condenses the red light on the pixel R, condenses the green light on the pixel G, condenses the blue light on the pixel B, and condenses the NIR light on the pixel NIR among the incident light.

[Structure Body]

In order to achieve the structure bodies 160 having different condensing positions depending on the wavelength region of the incident light, it is necessary to achieve a structure that gives a different optical wavefront for each wavelength region. In the first embodiment, both the wavelength separation function and the light condensing function are achieved by using a wavelength dispersion characteristic of a phase delay amount given to the incident light by fine columnar structure bodies 160.

The structure bodies 160 are formed by a material such as TiO$_2$ or SiN having a refractive index n$_1$ higher than a refractive index no of the transparent layer 150 or air around the structure, and heights (lengths in the z-axis direction) h of the structure bodies 160 in side view are constant. The structure bodies 160 can be considered as an optical waveguide that confines and propagates light in the structure from a refractive index difference with the transparent layer.

Therefore, when light is incident from the lens optical system 11 side, the light propagates while being strongly confined in the structure, receives a phase delay effect determined by an effective refractive index n$_{eff}$ of the optical waveguide, and is output from the pixel array 110 side.

Specifically, when the phase of light propagated through the transparent layer by a length corresponding to a thickness of the structure is used as a reference, a phase delay amount $\varphi$ by the structure bodies 160 is expressed by Expression (1) when the wavelength of the light in vacuum is $\lambda$.

[Math. 1]

$$\varphi = (n_{eff} - n_0) \times 2\pi h/\lambda \qquad (1)$$

Since the phase delay amount $\varphi$ varies depending on the wavelength $\lambda$ of light, it is possible to give different phase delay amounts depending on the wavelength region of light in the same structure body.

Furthermore, it is known that the effective refractive index n$_{eff}$ of the optical waveguide greatly depends on the cross-sectional shape of the structure body 160, and takes a value of $n_0 < n_{eff} < n_1$. Further, the effective refractive index n$_{eff}$ of the optical waveguide also varies depending on the wavelength $\lambda$ of light, and the degree of the refractive index n$_{eff}$ greatly depends on the cross-sectional shape of the structure body 160.

Therefore, by using the columnar structure bodies 160 having various cross-sectional shapes, it is possible to set various combinations of phase delay amounts according to the wavelength $\lambda$ of light, and it is possible to newly design and achieve lenses having different condensing positions depending on the wavelength region.

[Shape of Structure Body]

Figure 10:
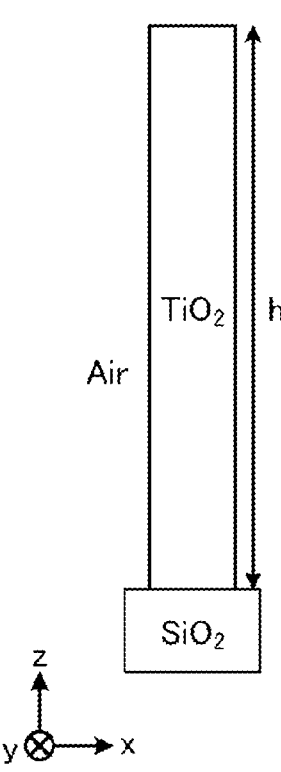
FIG. 10 is a view illustrating an example of a schematic configuration of a structure body.
Figure 11:
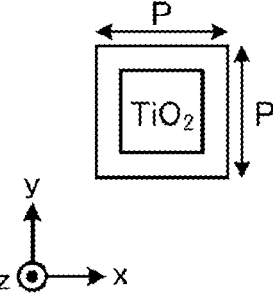
FIG. 11 is a view illustrating an example of a schematic configuration of the structure body.
Figure 12:
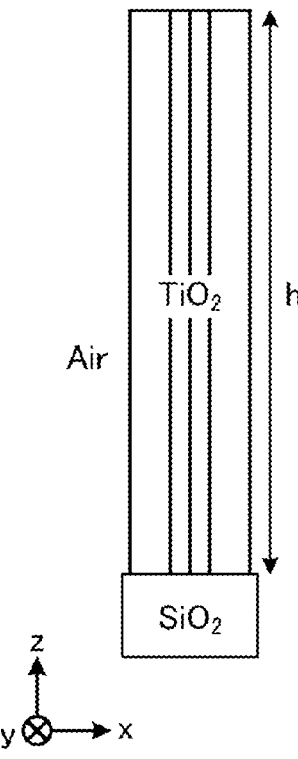
FIG. 12 is a view illustrating an example of a schematic configuration of a structure body.
Figure 13:
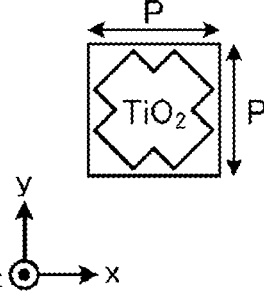
FIG. 13 is a view illustrating an example of a schematic configuration of the structure body.
Figure 14:
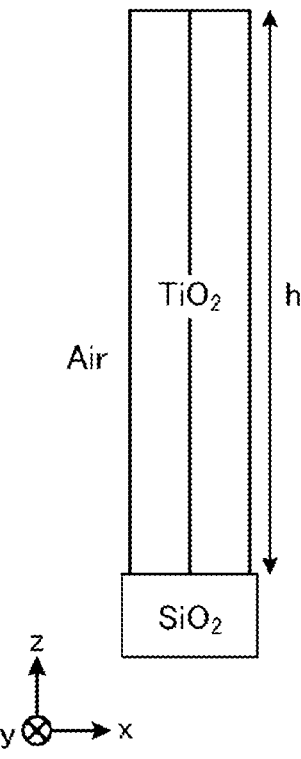
FIG. 14 is a view illustrating an example of a schematic configuration of a structure body.
Figure 15:
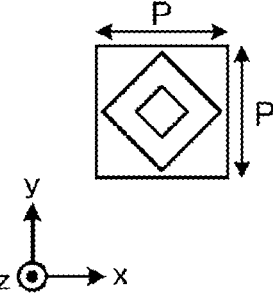
FIG. 15 is a view illustrating an example of a schematic configuration of the structure body.

FIGS. 10 to 15 are views illustrating an example of a schematic configuration of the structure body 160. FIG. 10 is a side view of the structure body 160 having a square shape in plan view. FIG. 11 is a plan view of the structure body 160 illustrated in FIG. 10. FIG. 12 is a side view of the structure body 160 having an X-shape in plan view. FIG. 13 is a plan view of the structure body 160 illustrated in FIG. 12. FIG. 14 is a side view of the structure body 160 having a hollow rhombus shape in plan view. FIG. 15 is a plan view of the structure body 160 illustrated in FIG. 14.

The structure body 160 is a columnar structure body extending in the z-axis direction, and is formed on the transparent layer 150 (for example, SiO$_2$ substrate (refractive index 1.45)). An example of a material of the structure body 160 is TiO$_2$ (refractive index 2.40). A side and an upper side of the structure body 160 are air (Air (refractive index: 1.0)).

An arrangement period of each structure body 160 is P. The arrangement period P is desirably set as in Expression (2) so that diffracted light does not occur on the transmission side.

[Math. 2]

$$P \leq \lambda_{min}/n_2 \qquad (2)$$

$\lambda_{min}$ is the shortest wavelength in the wavelength band of the light receiving target, and is, for example, 410 nm. n$_2$ is a refractive index of the transparent layer 150, and in a case where the transparent layer 150 is SiO$_2$, n$_2$=1.45. The arrangement period P of the structure body 160 is, for example, 280 nm.

In FIGS. 10 to 15, the height (length in the z-axis direction) of the structure body 160 in side view is referred to as a height h. The height h of the structure body 160 is constant. The height h is desirably set as in Expression (3) so that the structure body 160 can give an optical phase delay amount (phase value) of 2n or more to incident light, that is, light traveling along the z-axis direction.

[Math. 3]

$$h \geq \lambda_r/(n_1 - n_0) \quad (3)$$

The wavelength $\lambda_r$ is a desired center wavelength in a wavelength band on the longest wavelength side among wavelength bands of light to be subjected to wavelength separation. $n_1$ is a refractive index of the structure body 160. In a case where the structure body 160 is TiO$_2$, $n_1$=2.40, and the height h is, for example, 1250 nm. In addition, the structure body 160 may be formed by SiN (refractive index: 2.05). In this case, $n_1$=2.05, and the height h of the structure body 160 is, for example, 1600 nm.

By designing (including dimensional design) the cross-sectional shape of the structure body 160, various combinations capable of giving different optical phase delay amounts to light of each wavelength can be achieved. By diversifying the cross-sectional shape of the structure body 160, the number of combinations is increased, and the degree of freedom in design is further improved.

[Example of Lens Design]

An example of lens design will be described with reference to FIGS. 16 to 21. FIG. 16 is a view schematically illustrating a pixel arrangement of a pixel unit. In the lens design, the cross-sectional shapes and arrangement of the structure bodies 160 are designed so as to achieve an ideal optical phase delay amount distribution (phase distribution). In the example described below, the cross-sectional shapes and arrangement of the structure bodies 160 having a TiO2 composition structure are designed according to the ideal optical phase delay amount distribution for each center wavelength of the wavelength band of each of the red light, the green light, the blue light, and the near-infrared light so that the red light, the green light, the blue light, and the near-infrared light are condensed in each of the pixels R, G, B, and NIR illustrated in FIG. 16. For example, the size of the pixel is 1.68 µm×1.68 µm. The focal length is 5.0 µm. The center wavelength corresponding to the blue light is 430 nm. The center wavelength corresponding to the green light is 520 nm. The center wavelength corresponding to the red light is 635 nm. The center wavelength corresponding to the near-infrared light is 850 nm.

Assuming that an ideal optical phase delay amount distribution is φ, φ is expressed by the following Expression (4).

[Math. 4]

$$\varphi(x, y) = -\frac{2\pi}{\lambda_d} n_2 \left( \sqrt{(x - x_f)^2 + (y - y_f)^2 + z_f^2} - \sqrt{x_f^2 + y_f^2 + z_f^2} \right) + C \quad (4)$$

In the above Expression (4), $\lambda_d$ is a center wavelength (design wavelength). $x_f$, $y_f$, and $z_f$ are condensing positions. $n_2$ is a refractive index of the lower transparent layer 150. C is an arbitrary constant.

The ideal optical phase delay amount distribution is a phase distribution that gives the following condensing positions respectively to the pixel B, the pixel G, the pixel R, and the pixel NIR. Note that the center positions of the four pixels (pixel units) correspond to x=0 and y=0.

Pixel B: xf=+0.84 µm, yf=−0.84 µm, zf=5.0 µm
Pixel G: xf=+0.84 µm, yf=+0.84 µm, zf=5.0 µm
Pixel R: xf=−0.84 µm, yf=+0.84 µm, zf=5.0 µm
Pixel NIR: xf=−0.84 µm, yf=−0.84 µm, zf=5.0 µm φ is converted so as to fall within the range of 0 to 2 π. For example, −0.5 π and 2.5 π are converted into 1.5 π and 0.5 π, respectively. A boundary region of the optical phase delay amount distribution is set so that the optical phase delay amount distribution at each center wavelength is horizontally and vertically symmetric about the condensing position (together with the adjacent lens). The constant C may be optimized so that the error (difference from the ideal value) of the optical phase delay amount distribution is minimized at each wavelength. From the optical phase delay amount at each wavelength, a structure most suitable for the optical phase delay amount distribution at each center wavelength of the four wavelengths (structure with the smallest error) is arranged at a corresponding position.

Figure 19:
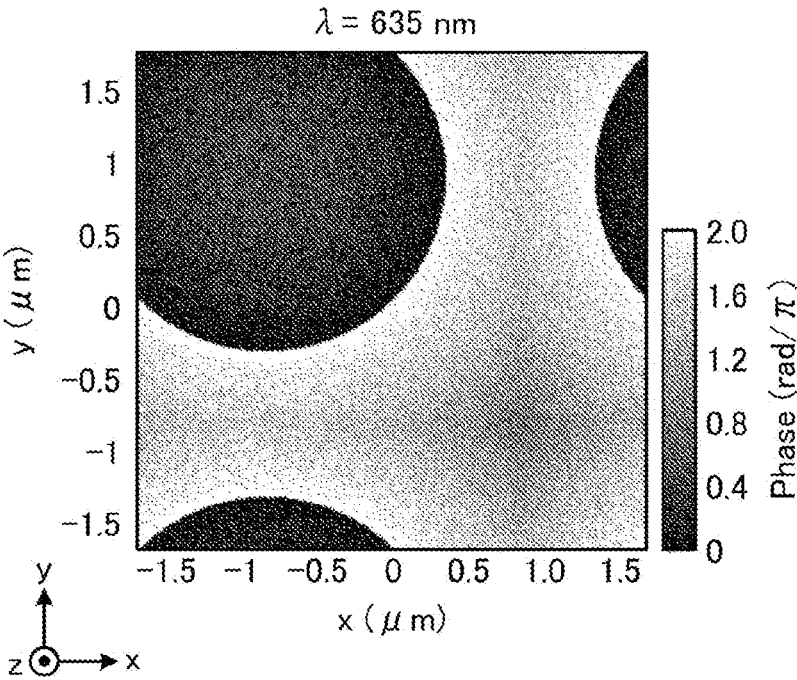
FIG. 19 is a view illustrating an example of the lens design in a case where the structure bodies are $TiO_2$.
Figure 20:
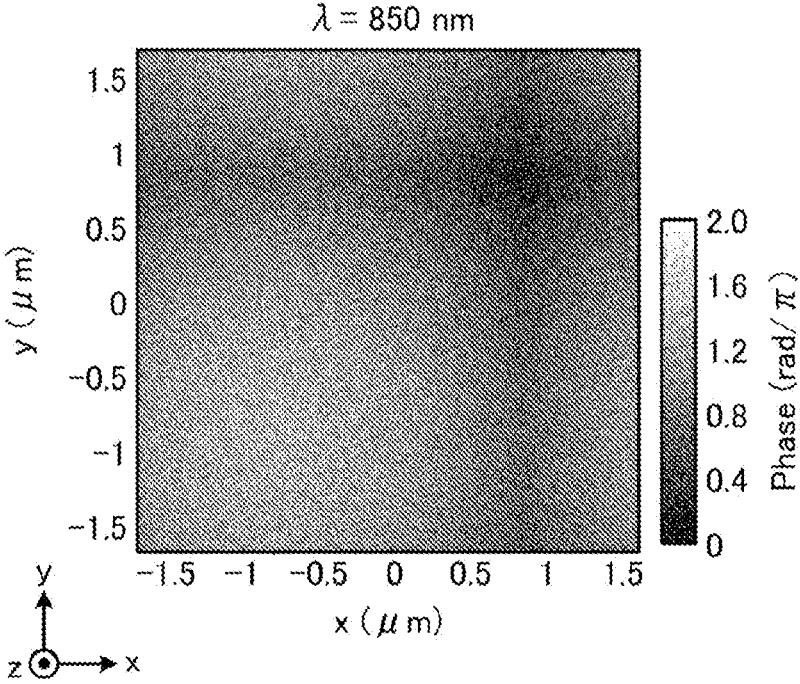
FIG. 20 is a view illustrating an example of the lens design in a case where the structure bodies are $TiO_2$.
Figure 21:
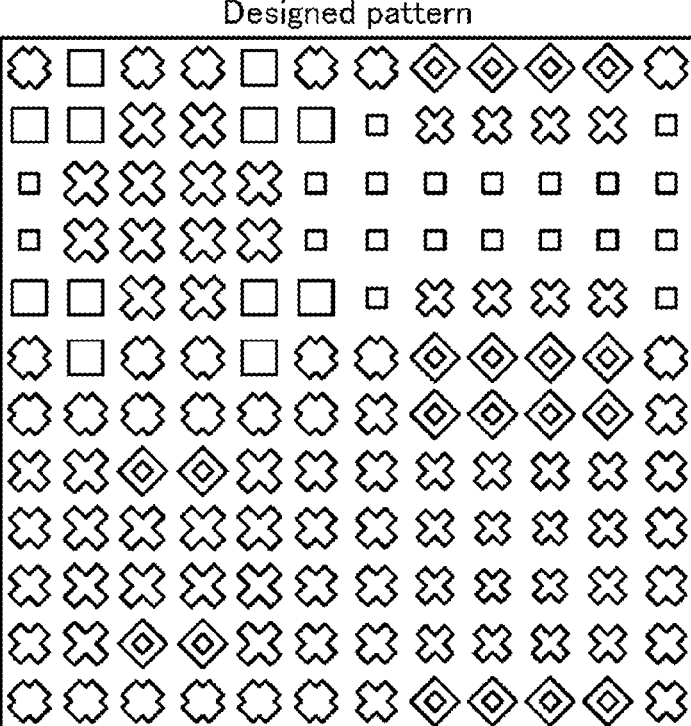
FIG. 21 is a view illustrating an example of the lens design in a case where the structure bodies are $TiO_2$.

FIGS. 17 to 21 are views illustrating examples of the lens design in a case where the structure bodies 160 are TiO$_2$. FIG. 21 is a plan view illustrating an example of the shapes and arrangement of the structure bodies 160 in plan view. As illustrated in FIG. 21, a plurality of structure bodies 160 is formed in the shapes and arrangement for condensing light having wavelengths respectively corresponding to the pixels R, G, B, and NIR illustrated in FIG. 16. Note that the center position in FIG. 21 corresponds to x=0 and y=0.

Figure 17:
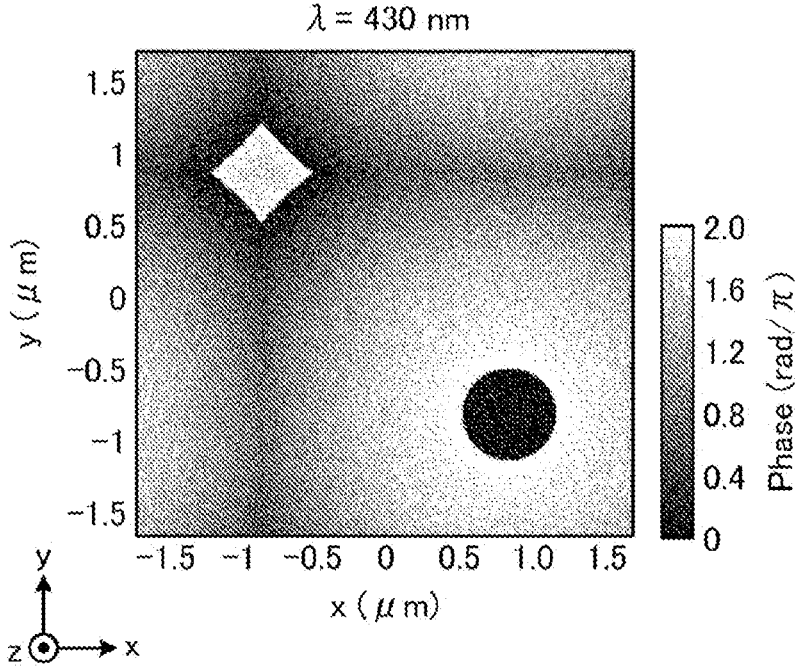
FIG. 17 is a view illustrating an example of a lens design in a case where the structure bodies are $TiO_2$.
Figure 18:
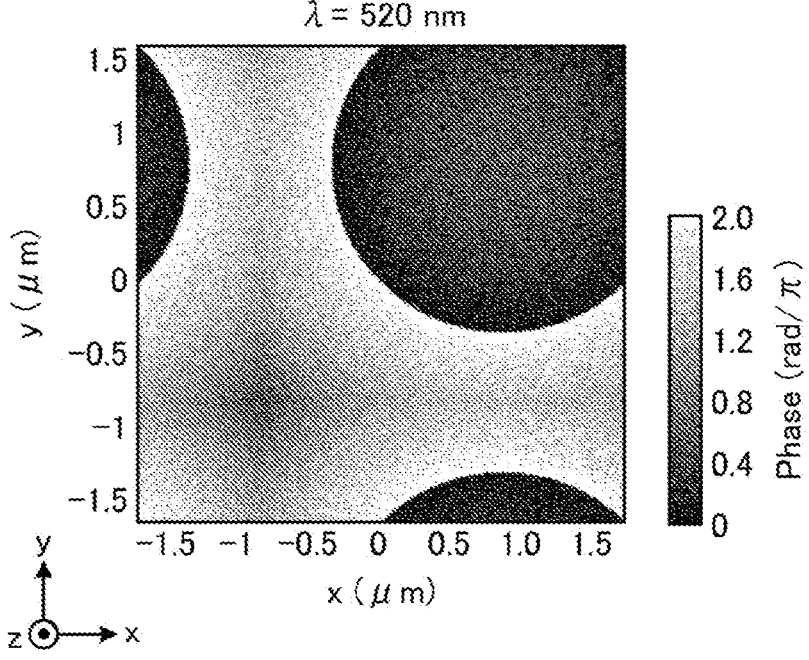
FIG. 18 is a view illustrating an example of the lens design in a case where the structure bodies are $TiO_2$.

FIG. 17 illustrates an ideal optical phase delay amount distribution (phase (rad/n)) in a case where the center wavelength is 430 nm (blue light). FIG. 18 illustrates an ideal optical phase delay amount distribution in a case where the center wavelength is 520 nm (green light). FIG. 19 illustrates an ideal optical phase delay amount distribution in a case where the center wavelength is 635 nm (red light). FIG. 20 illustrates an ideal optical phase delay amount distribution in a case where the center wavelength is 850 nm (near-infrared light).

FIG. 21 is a plan view of the structure bodies 160 capable of achieving the optical phase delay amount distribution in each of FIGS. 17 to 20, and is a shape pattern of the structure bodies 160 designed per pixel unit (see FIG. 16). As illustrated in FIG. 21, shapes of the structure bodies 160 are square-shaped, x-shaped, and hollow rhombic prisms. Planar shapes of the structure bodies 160 are each set to shapes capable of achieving the phase at the corresponding position in the optical phase delay amount distribution illustrated in FIGS. 17 to 20. For this reason, the planar shapes of the structure bodies 160 may be set to one type (for example, a square shape) instead of a plurality of types of shapes such as a square shape, a X shape, and a hollow rhombus. Further, the shapes of the structure bodies 160 are not limited to wavelength regions to be separated, and any one of a square shape, a x shape, and a hollow rhombus can be set. Note that the types of the planar shapes of the structure bodies 160 may be set for each wavelength region to be separated.

Figure 22:
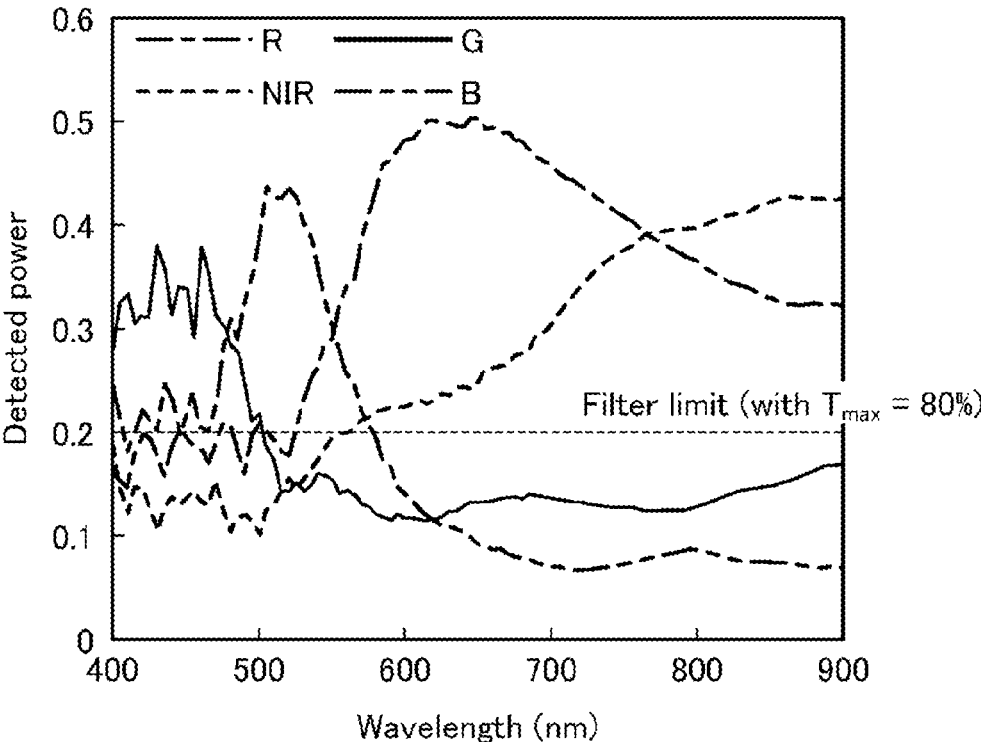
FIG. 22 is a diagram illustrating an example of spectra of light received by respective pixels in a case where the structure bodies are $TiO_2$.

FIG. 22 is a diagram illustrating an example of spectra of light received by respective pixels in a case where the structure bodies 160 are TiO$_2$. The spectrum is a spectrum when a non-polarized planar light wave is perpendicularly incident on a substrate (xy plane). The distance from the lower end (lens structure end) of the structure body 160 to the pixel array 110 is 5.0 µm (lens focal length). The horizontal axis of the graph indicates a wavelength (Wavelength (nm)). The vertical axis represents light receiving efficiency (Detected power). The light receiving efficiency is (light intensity on one pixel)/(incident light intensity on structure body 160 (lens (area of four pixels))). For example, when half of the light incident on the structure body 160 is incident on the pixel, the light receiving efficiency becomes 0.5.

Light is condensed on each pixel so that each pixel has a peak in a wavelength band of corresponding light. A spectrum of light incident on the pixel R is indicated by a graph line R. A spectrum of light incident on the pixel G is indicated by a graph line G. A spectrum of light incident on the pixel B is indicated by a graph line B. A spectrum of light incident on the pixel NIR is indicated by a graph line NIR. As a comparative example, an upper limit value 0.2 of the light receiving efficiency in a case where a general filter (color filter) is used instead of the optical element array 120 according to the first embodiment is indicated as Filter limit (with Tmax=80%). The upper limit value 0.2 of the light receiving efficiency is a value (0.8/4=0.2) obtained by dividing a filter having a transmittance of at most 80% at each wavelength into four pixels of the pixel R, the pixel G, the pixel B, and the pixel NIR.

It can be seen that each of the pixel R, the pixel G, the pixel B, and the pixel NIR has a peak value larger than the upper limit value 0.2 of the comparative example, and the amount of received light in the pixel is larger than that of the comparative example. For example, at a wavelength of 430 nm, the light receiving efficiency of the pixel B greatly exceeds the upper limit value 0.2 of the comparative example. Even at the wavelength of 525 nm, the light receiving efficiency of the pixel G greatly exceeds the upper limit value 0.2 of the comparative example. Even at the wavelength of 635 nm, the light receiving efficiency of the pixel R greatly exceeds the upper limit value 0.2 of the comparative example. Even at the wavelength of 850 nm, the light receiving efficiency of the pixel NIR greatly exceeds the upper limit value 0.2 of the comparative example.

The total transmittance of the lens, that is, the value obtained by averaging (the sum of the light intensities on all the pixels)/(the incident light intensity on the structure body 160) over the wavelengths of 400 nm to 900 nm is 94.7%, and almost all the incident light can be received, greatly exceeding the upper limit value to 30% in the case of using a general filter. Also from this, it has been found that the light receiving efficiency can be improved in any pixel of the pixel R, the pixel G, the pixel B, and the pixel NIR, and the increase in the light receiving amount has been checked.

Effects of First Embodiment

As described above, with the optical element array 120, both functions of the wavelength separation function for red light, green light, blue light, and near-infrared light and the lens function are achieved. For example, the imaging element according to the related art includes a filter (for example, a color filter) instead of the optical element array 120. That is, for example, in the imaging element according to the related art, a filter corresponding to the color of each pixel is provided so as to cover the pixel. In this case, for example, in the imaging element according to the related art, since light having a wavelength other than the transmission wavelength band is absorbed by the filter, the amount of light after being transmitted through the filter remains only about ¼ of the amount of light incident on the filter, and the light receiving efficiency decreases.

On the other hand, according to the imaging element 100 of the first embodiment, the light reception amount is maintained larger than that (for example, larger than 90%) as described above, so that the light receiving efficiency is greatly improved. In addition, since the imaging element 100 according to the present embodiment may not be provided with a filter, color calibration processing for generating a color image, which is necessary in the conventional imaging element, is also unnecessary, and color reproducibility can be improved.

In addition, some conventional technologies have a microlens provided (integrated) on the side opposite to the pixel across the filter in order to increase the amount of received light (improve sensitivity) by improving an aperture ratio, reducing light incident angle dependency, and the like. In this case, since a two-layer structure of at least a filter and a microlens is formed, the structure becomes complicated and the manufacturing cost also increases.

On the other hand, with the optical element array 120 of the first embodiment, since the wavelength separation function and the lens function can be achieved only by the optical element array 120, the structure can be simplified and the manufacturing cost can be reduced. Further, since the plurality of structure bodies 160 can be arranged without gaps within a plane (in the xy plane), the aperture ratio increases as compared with the microlens.

Note that the signal processing unit 13 illustrated in FIG. 1 generates a pixel signal on the basis of an electric signal obtained from the imaging element 12. In order to obtain the electric signal, the signal processing unit 13 also controls the imaging element 12. The control of the imaging element 12 includes exposure of pixels of the imaging element 12, conversion of charges accumulated in the pixel array 110 into electric signals, reading of the electric signals, and the like.

Further, the optical element array 120 is not limited to the above configuration, and can take various forms in the number, interval, structural shape, and arrangement pattern of the structure bodies 160. In addition, the structure bodies 160 may be connected to each other or may be embedded in a transparent material.

Figure 23:
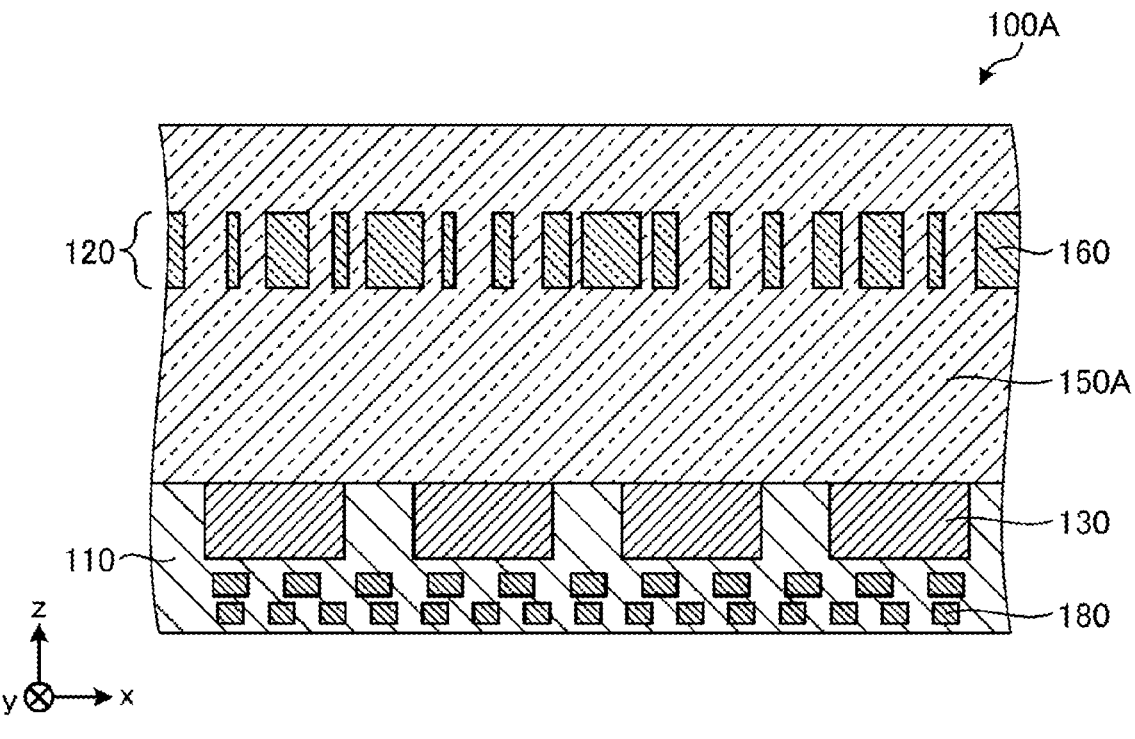
FIG. 23 is a view schematically illustrating another example of a part of the cross sections of the pixel array and the optical element array in the imaging element according to the first embodiment.
Figure 24:
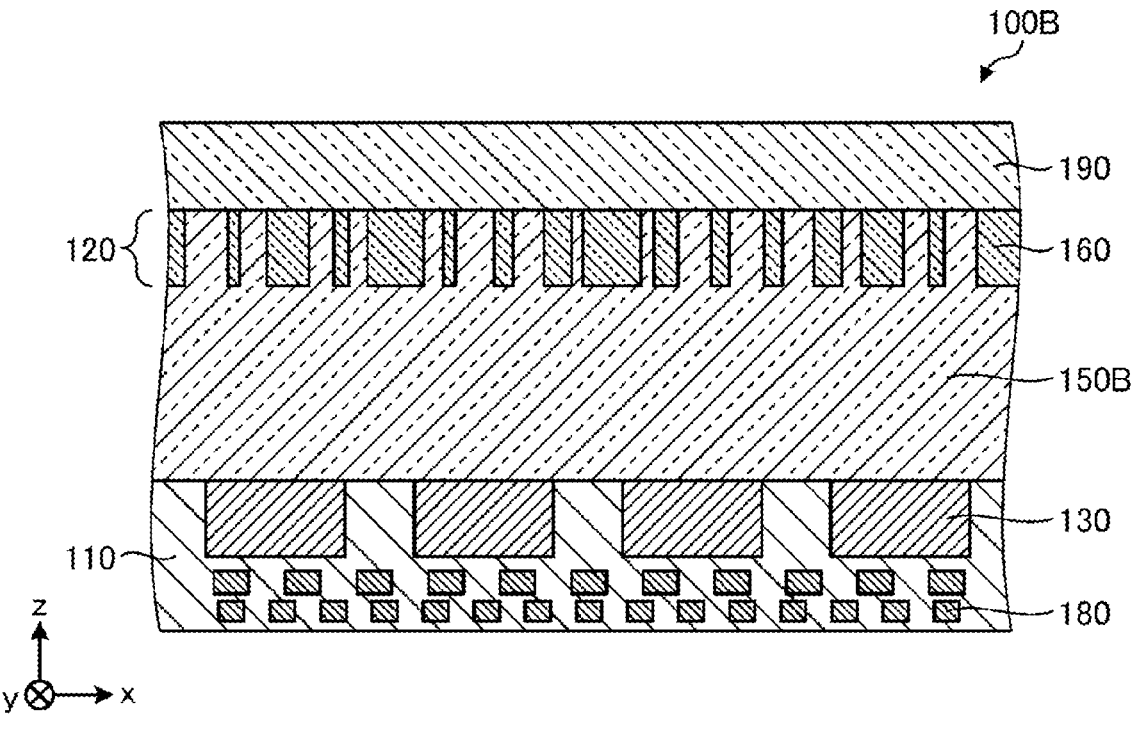
FIG. 24 is a view schematically illustrating another example of a part of the cross sections of the pixel array and the optical element array in the imaging element according to the first embodiment.

Further, in FIGS. 3 and 4, the optical element array 120 is formed on the upper surface of the transparent layer 150, but the present invention is not limited thereto. FIGS. 23 and 24 are views schematically illustrating another example of a part of cross sections of the pixel array and the optical element array in the imaging element according to the first embodiment.

As illustrated in an imaging element 100A of FIG. 23, the optical element array 120 may be embedded inside a transparent layer 150A on the pixels 130. At this time, the material of the transparent layer 150A may be a single material or a plurality of layered materials. In addition, as illustrated in the imaging element 100B of FIG. 24, the optical element array 120 may be formed on a bottom surface of an independent transparent substrate 190. In this case, the region between the optical element array 120 and the pixel 130 is filled with air 150B. At this time, the material of the transparent substrate 190 may be a single material or a plurality of layered materials. The imaging elements 100, 100A, and 100B can be used in combination with an on-chip microlens, an internal microlens, an inter-pixel barrier for reducing crosstalk, and the like.

Further, in the above description, an example in which four pixels are located immediately below one optical element unit has been described, but the present invention is not limited thereto.

Figure 25:
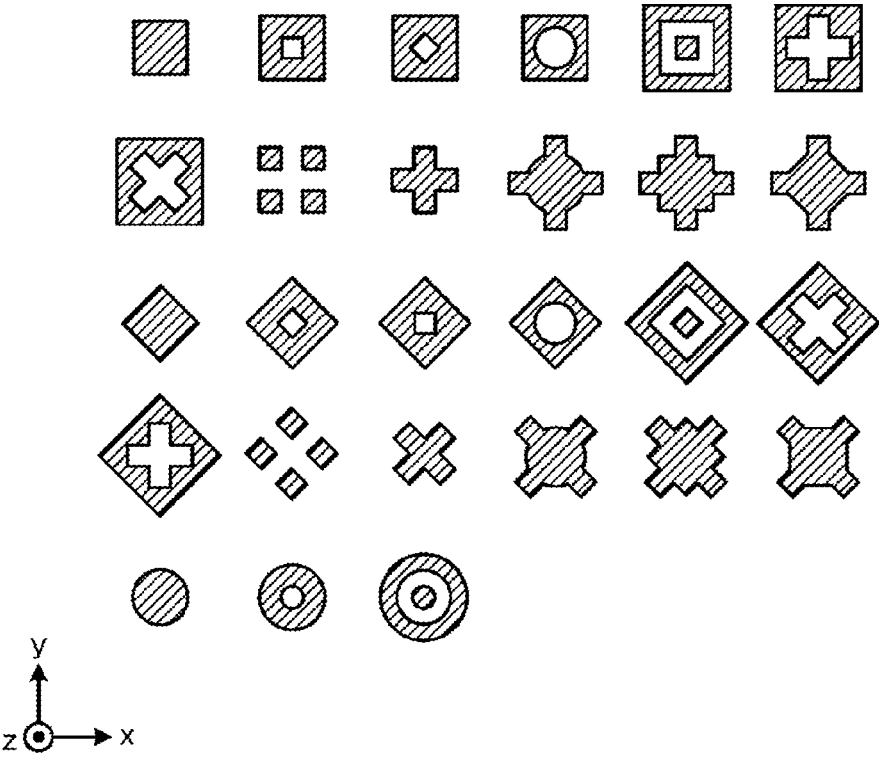
FIG. 25 is a view illustrating an example of cross-sectional shapes of structure bodies.

Further, the cross-sectional shapes of the structure bodies 160 are not limited to the shape illustrated in FIG. 5 and the like described above. FIG. 25 is a view illustrating an example of the cross-sectional shapes of the structure bodies. The structure bodies 160 may have various cross-sectional shapes as exemplified in FIG. 25. Exemplary shapes are, for example, four-fold rotationally symmetrical shapes obtained by variously combining square, cross, and circular shapes.

Second Embodiment

Figure 26:
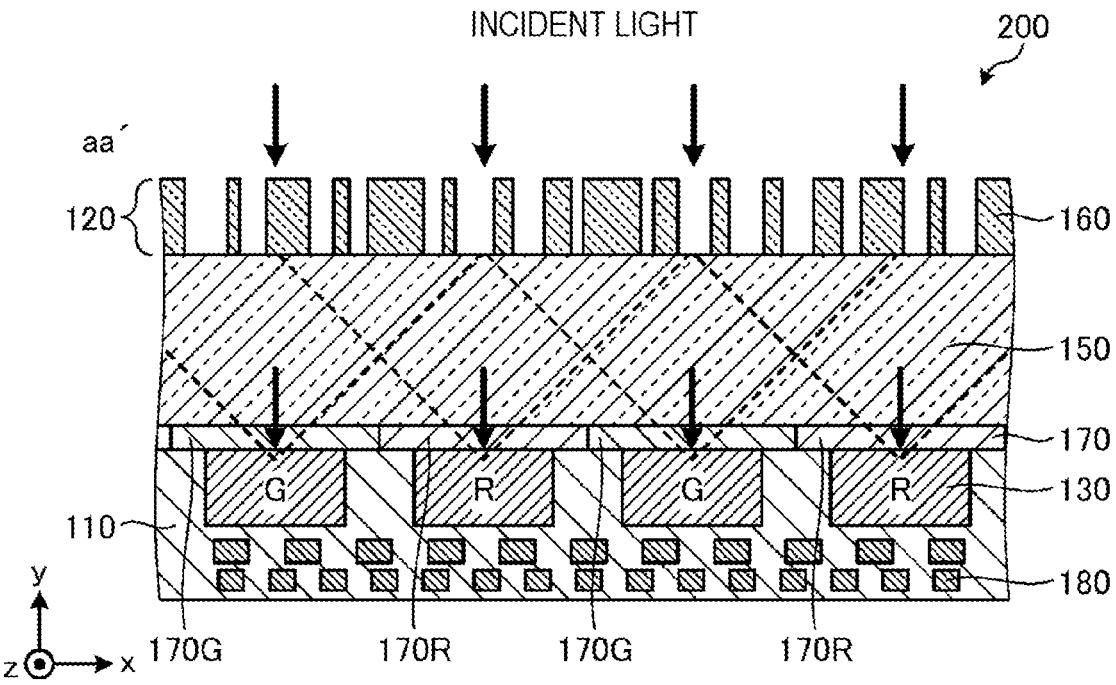
FIG. 26 is a view illustrating an example of a schematic configuration of an imaging element according to a second embodiment.
Figure 27:
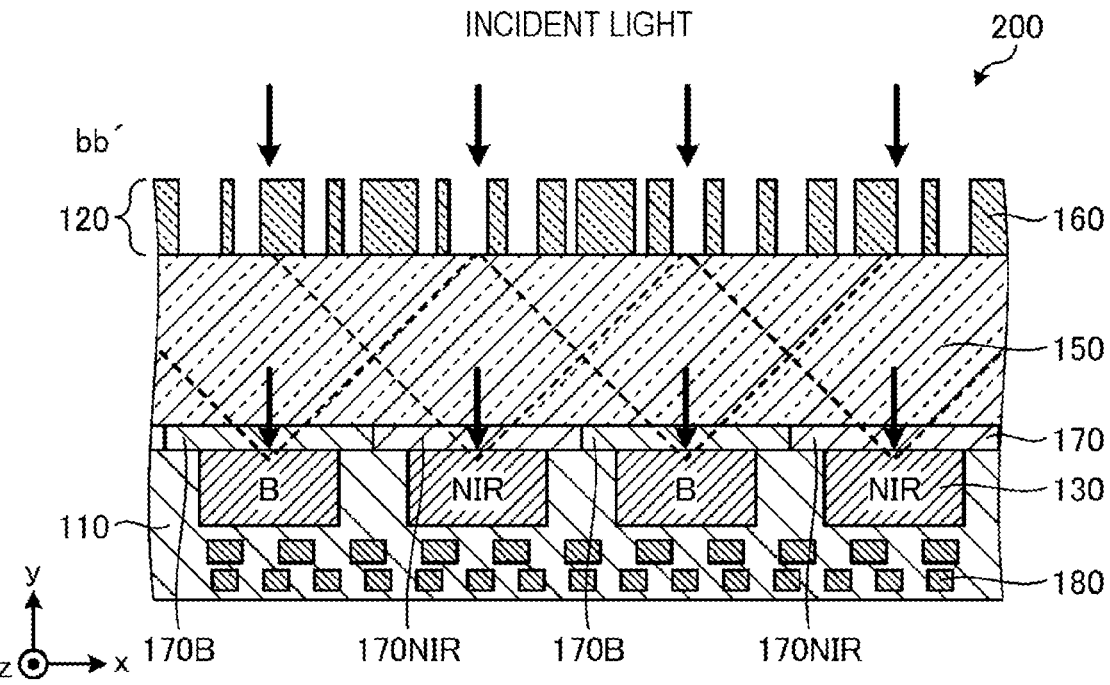
FIG. 27 is a view illustrating an example of a schematic configuration of the imaging element according to the second embodiment.

In a second embodiment, a configuration in which an imaging element includes a filter will be described. FIGS. 26 and 27 are views illustrating an example of a schematic configuration of an imaging element according to the second embodiment.

The imaging element 200 illustrated in FIGS. 26 and 27 includes a filter layer 170 provided between the pixel array 110 and the optical element array 120. FIG. 26 illustrates an example of a cross section of the imaging element 200 in side view along line a-a' in a case where the imaging element 100 is replaced with the imaging element 200 in FIG. 2. FIG. 27 illustrates an example of a cross section of the imaging element 200 in side view along the line b-b' in a case where the imaging element 100 is replaced with the imaging element 200 in FIG. 2.

The filter layer 170 includes a filter 170R that is provided so as to cover the pixel R and transmits red light, a filter 170G that is provided so as to cover the pixel G and transmits green light, a filter 170B that is provided so as to cover the pixel B and transmits blue light, and a filter 170NIR that is provided so as to cover the pixel NIR and transmits near-infrared light. An example of the material of the filter layer 170 is an organic material such as resin.

The light color-separated by the optical element array 120 further passes through the filter layer 170 and then reaches the pixel array 110. By the wavelength separation of both the optical element array 120 and the filter layer 170, the crosstalk of the spectrum is suppressed (most of unnecessary other wavelength components are removed) and color reproducibility is improved as compared with a case where the wavelength separation is performed only on one side. Further, since the incident light passes through the filter layer 170 after being separated by the optical element array 120, the amount of light is not greatly reduced. Therefore, the light receiving efficiency of the pixel is improved as compared with a case where the optical element array 120 is not provided and only the filter layer 170 is provided.

Figure 28:
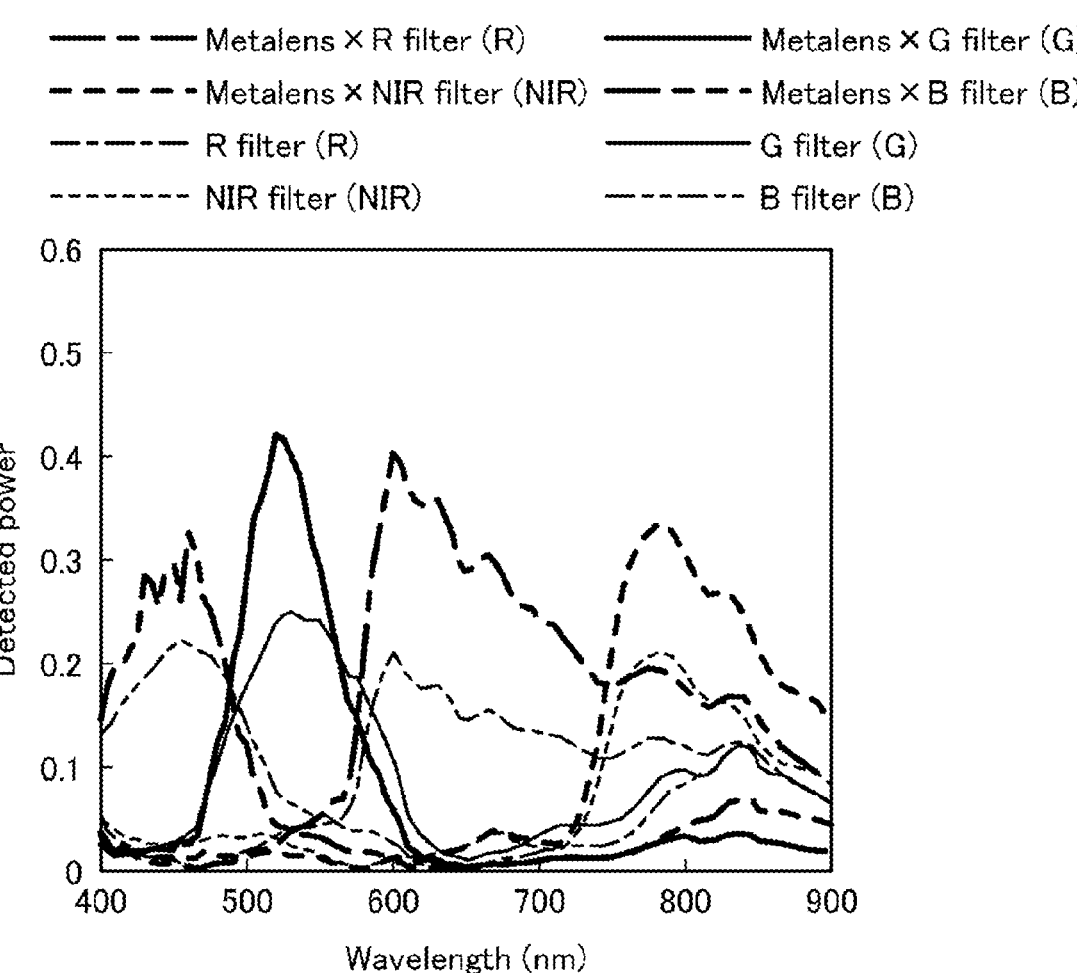
FIG. 28 is a diagram illustrating an example of spectra of light received by respective pixels of the imaging element illustrated in FIGS. 26 and 27.
Figure 29:
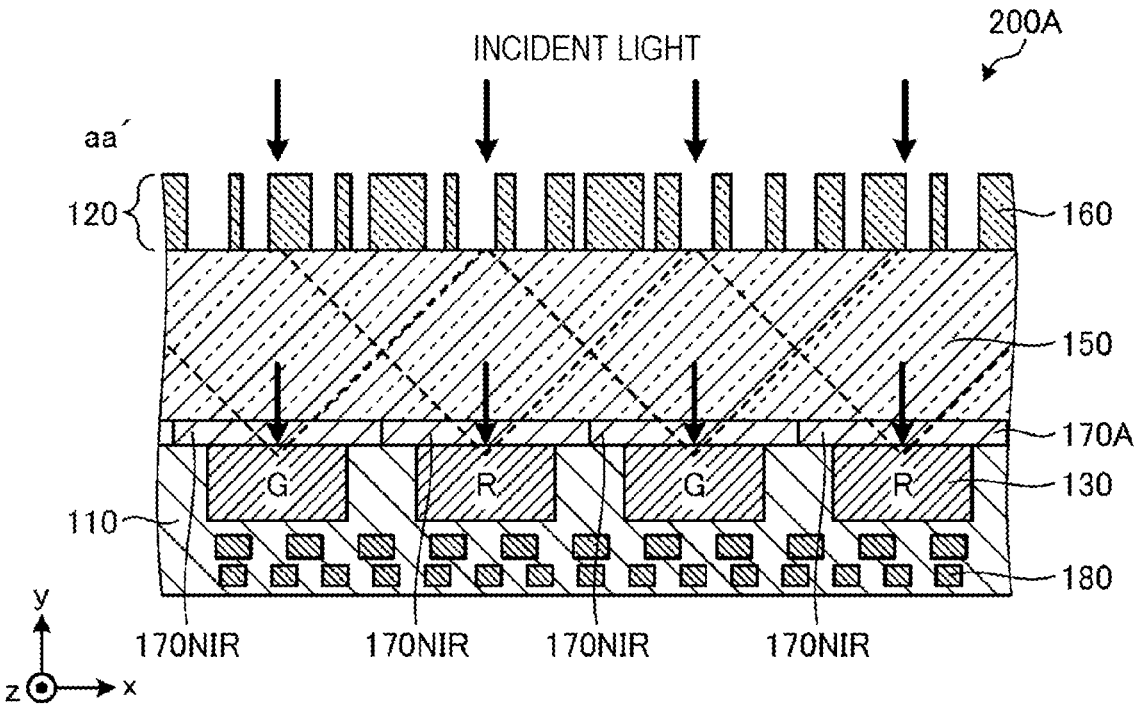
FIG. 29 is a view illustrating an example of a schematic configuration of an imaging element according to a modification example of the second embodiment.
Figure 30:
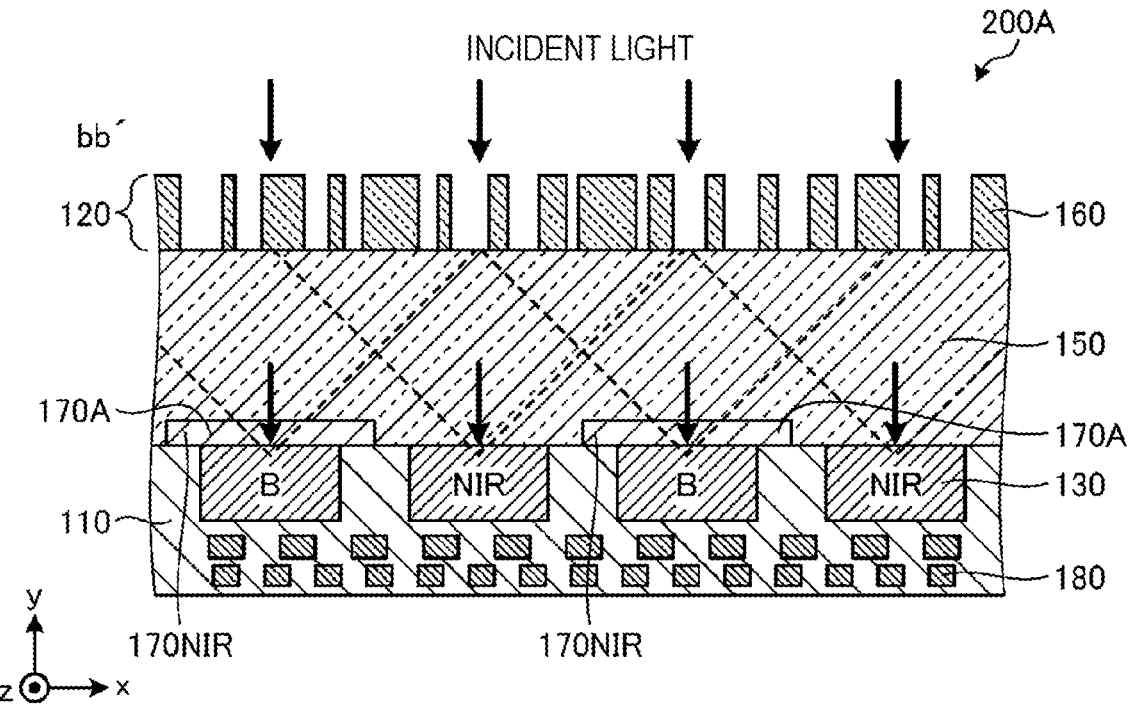
FIG. 30 is a view illustrating an example of a schematic configuration of an imaging element according to a modification example of the second embodiment.
Figure 31:
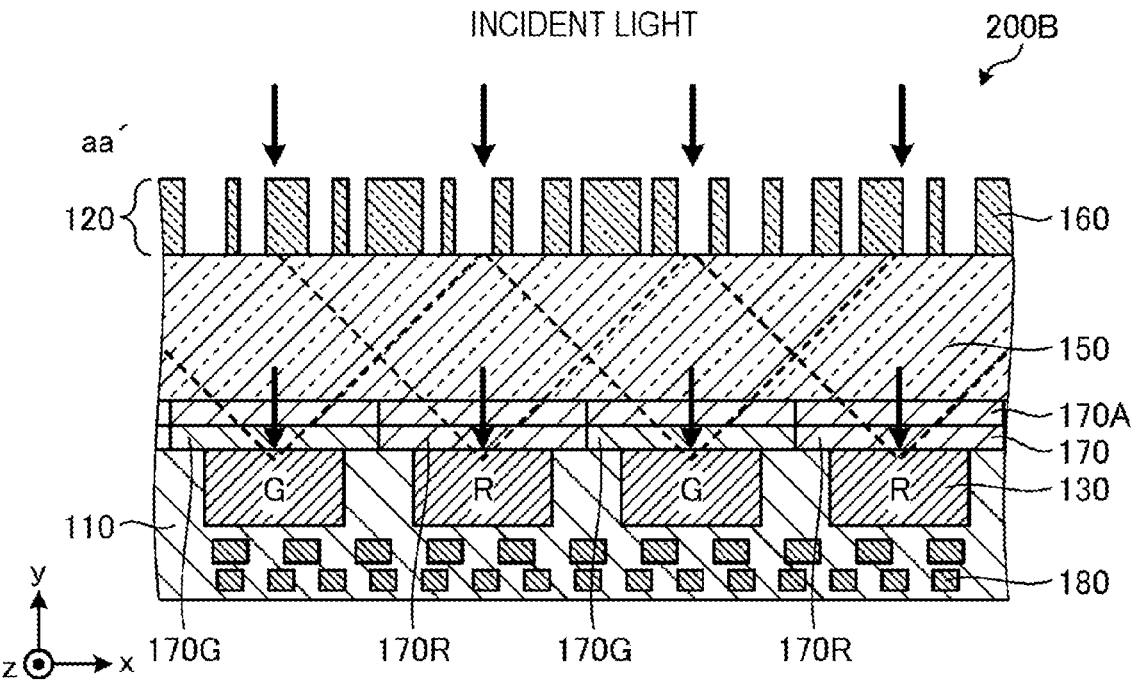
FIG. 31 is a view illustrating an example of a schematic configuration of an imaging element according to a modification example of the second embodiment.
Figure 32:
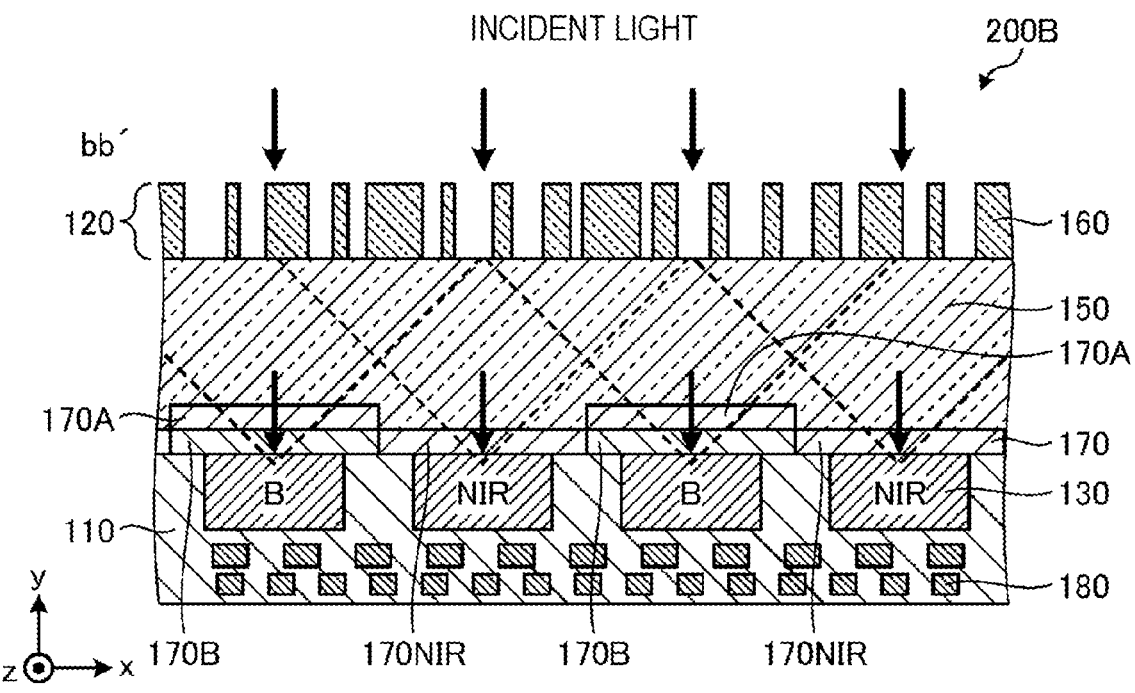
FIG. 32 is a view illustrating an example of a schematic configuration of an imaging element according to a modification example of the second embodiment.

FIG. 28 is a diagram illustrating an example of spectra of light received by respective pixels of the imaging element 200 illustrated in FIGS. 26 and 27. FIG. 28 illustrates an example of spectra in a case where the structure bodies 160 are $TiO_2$.

In FIG. 28, the light receiving efficiency of the pixel R is indicated by a graph line Metalens×R filter (R). The light receiving efficiency of the pixel G is indicated by a graph line Metalens×G filter (G1 or G2). The light receiving efficiency of the pixel B is indicated by a graph line Metalens×B filter (B). The light receiving efficiency of the pixel NIR is indicated by a graph line Metalens×NIR filter (NIR). As a comparative example, the light receiving efficiency of the pixel R in a case where the optical element array 120 is not provided and only a general filter is provided is indicated by a graph line R filter (R). The light receiving efficiency of the pixel G is indicated by a graph line G filter (G1 or G2). The light receiving efficiency of the pixel B is indicated by a graph line B filter (B). The light receiving efficiency of the pixel NIR is indicated by a graph line filter (NIR). Note that, for a sensitivity spectrum of each pixel of the RGB-IR sensor provided with only the filter described as a comparative example, Reference Document 1 was referred to.

Reference Document 1: Y. Monno, H. Teranaka, K. Yoshizaki, M. Tanaka, & M. Okutomi, (2018). "Single-sensor RGB-NIR imaging: High-quality system design and prototype implementation". IEEE Sensors Journal, 19 (2), 497-507.

The peak values of the spectra of the pixel R, the pixel G, the pixel B, and the pixel NIR are about 1.5 to 1.9 times those in the comparative example, and higher light receiving efficiency can be obtained than in the comparative example. The total transmittance is also 39.4%, which exceeds 32.9% of the comparative example (about 1.20 times). Furthermore, the spectrum of the light incident on each pixel is also sharper than the spectrum of the comparative example, and it can be seen that other unnecessary wavelength components can be reduced accordingly. Thus, the color reproducibility is improved.

Effects of Second Embodiment

As described above, with the imaging element 200 further including the filter layer 170, the light receiving efficiency can be improved, and the color reproducibility can be further improved.

Modification Example of Second Embodiment

FIGS. 29 to 32 are views illustrating an example of a schematic configuration of an imaging element according to a modification example of the second embodiment. As illustrated in the imaging element 200A in FIGS. 29 and 30, a near-infrared absorption filter 170A may be provided instead of the filter layer 170. In addition, as illustrated in the imaging element 200B in FIGS. 31 and 32, the near-infrared absorption filter layer 170A may be provided on (or below) the filter layer 170. The near-infrared absorption filter layer 170A includes a filter 170NIR that is provided immediately above only the pixel R, the pixel G, and the pixel B so as to cover only the pixel R, the pixel G, and the pixel B and absorbs near-infrared light. As described above, since the near-infrared absorption filter layer 170A is provided only immediately above the pixel R, the pixel G, and the pixel B, it is possible to suppress incidence of near-infrared light, which becomes a noise factor, on the pixel R, the pixel G, and the pixel B. Note that since the pixel NIR needs to receive near-infrared light, the filter 170NIR is not provided on the pixel NIR.

Note that, in the first and second embodiments, TiO2 and SiN have been described as examples of the material of the structure bodies 160. However, the material of the structure bodies 160 is not limited thereto. For example, for light having a wavelength of 380 nm to 1000 nm (visible light to near-infrared light), SiC, TiO2, GaN, or the like may be used as the material of the structure bodies 6 in addition to SiN. This is suitable because the refractive index is high and the absorption loss is small. In the case of using light having a wavelength of 800 to 1000 nm (near-infrared light), Si, SiC, SiN, TiO2, GaAs, GaN, or the like may be used as the material of the structure bodies 6. It is suitable because of its low loss. For light in a near-infrared light region in a long wavelength band (such as 1.3 μm or 1.55 μm as a communication wavelength), InP or the like can be used as the material of the structure bodies 160 in addition to the above-described materials.

Further, in a case where the structure bodies 160 are formed by bonding, coating, or the like, polyimide such as fluorinated polyimide, BCB (benzocyclobutene), a photo-curable resin, a UV epoxy resin, an acrylic resin such as PMMA, and polymers such as resists in general may be mentioned as materials.

Further, in the first and second embodiments, the example in which SiO$_2$ and an air layer are assumed as the material of the transparent layer 150 has been described, but the material is not limited thereto. Any material may be used as long as it has a refractive index lower than the refractive index of the material of the structure bodies 160 and has a low loss with respect to the wavelength of incident light, including a general glass material and the like. The transparent layer 150 only needs to have a sufficiently low loss with respect to the wavelength of light to reach the corresponding pixel, and thus may include a material similar to that of the color filter, and may include an organic material such as resin, for example. In this case, the transparent layer 150 may not only include a material similar to that of the color filter, but may also have a structure similar to that of the color filter and may be designed to have absorption characteristics according to the wavelength of light to be guided to the corresponding pixel.

In addition, in the first and second embodiments, the three primary colors of RGB and the near-infrared light have been described as examples of the corresponding color of the pixel, but the pixel may also correspond to light of wavelengths other than the near-infrared light and the three primary colors (for example, infrared light, ultraviolet light, and the like).

Further, in the first and second embodiments, the example has been described in which the structure bodies having three different cross-sectional shapes of a square shape, a X shape, and a hollow rhombus is used as the shapes of the structure bodies 160. This shape is an example, and two types of structure bodies (for example, only a square shape or a cross shape is used) may be used, or four or more types of structure bodies may be used.

Although the present invention has been described above on the basis of specific embodiments, the present invention is not limited to the above-described embodiments, and it goes without saying that various modifications can be made without departing from the gist of the present invention.

The technology described above is specified as follows, for example. As described with reference to FIGS. 1 to 5, 23, 24, and the like, the optical element array 120 includes the transparent layer 150 for covering a plurality of pixels each including a photoelectric conversion element, and the plurality of structure bodies 160 arranged on the transparent layer 150 or in the transparent layer 150 in a plane direction (XY planar direction) of the transparent layer 150, and the plurality of structure bodies 160 is arranged in such a manner that, among incident light, first light having a wavelength in a near-infrared light region is condensed on a first pixel (pixel NIR) among the plurality of pixels, and light of a second color (for example, blue) having a wavelength in a region outside the near-infrared light region is condensed on a second pixel (for example, pixel B) among incident light.

The optical element array 120 has both a function of separating a wavelength in a near-infrared light region from a wavelength in another region and a lens function (light condensing function). Therefore, for example, as compared with a case where a filter (for example, a color filter) corresponding to each pixel is provided or a microlens is provided, it is possible to greatly improve the light receiving efficiency of visible light and near-infrared light of incident light in the pixel and to improve the light receiving sensitivity. In addition, since the structure is simplified, the manufacturing cost can be reduced. Since the plurality of structure bodies 160 can be arranged without gaps within a plane, the aperture ratio also increases as compared with the microlens. The color separation function and the lens function are not limited to the function of separating and condensing the wavelength in the near-infrared light region and the wavelength in the another region, and may correspond to near-infrared light and light of three or two colors.

As described with reference to FIGS. 1 to 5, 23, 24, and the like, the optical element array 120 may include the transparent layer 150 for covering a plurality of pixels each including a photoelectric conversion element, and the plurality of structure bodies 160 arranged on the transparent layer 150 or in the transparent layer 150 in a plane direction (planar direction) of the transparent layer 150, and first light that is a wavelength in a near-infrared light region among the incident light is output, and light of a second color having a wavelength in a region outside the near-infrared light region among the incident light is output. Thus, the optical element array 120 has a function of separating a wavelength in a near-infrared light region from a wavelength in another region.

As described with reference to FIGS. 10 to 15 and the like, each of the plurality of structure bodies 160 may be a columnar structure body having a refractive index higher than a refractive index of the transparent layer 5 and giving an optical phase delay amount according to a cross-sectional shape to the incident light. As described with reference to FIGS. 16 to 21 and the like, the plurality of structure bodies 160 may be arranged according to the optical phase delay amount distribution for achieving the above-described light condensation. For example, both functions of the wavelength separation function and the lens function can be achieved by the arrangement of the plurality of structure bodies 160.

As described with reference to FIGS. 5 and 25, and the like, a cross-sectional shape of each of the plurality of structure bodies 160 may be a four-fold rotationally symmetrical shape. Thus, polarization dependency can be prevented from occurring.

As described with reference to FIGS. 6 to 9 and the like, the plurality of structure bodies 6 may be arranged in such a manner that light having a wavelength corresponding to one pixel among light incident on an outside of a region facing the one pixel is also condensed on the one pixel. Thus, the amount of received light can be increased as compared with a case where only light incident on the region facing the one pixel is condensed on the pixel.

The imaging element 100 described with reference to FIGS. 1 to 5 and the like is also one aspect of the present disclosure. The imaging element 100 includes an optical element array 120 and a plurality of pixels 130 (pixels NIR and the like) covered with a transparent layer 150. Thus, as described above, the manufacturing cost can be reduced. The light receiving sensitivity can be improved or the aperture ratio can be increased.

As described with reference to FIGS. 26 and 27, and the like, the imaging element 200 may include the filter layer 170 provided between the plurality of pixels (pixels NIR and the like) and the transparent layer 150. Thus, the light receiving efficiency can be improved, and the color reproducibility can be further improved.

Then, as described with reference to FIGS. 29 to 32, the imaging elements 200A and 200B may be provided with the near-infrared absorption filter 170A provided only on the second pixel. A near-infrared absorption filter that absorbs near-infrared light may be provided immediately above the second pixel (pixel R, pixel G, and pixel B) to suppress incidence of near-infrared light that causes noise on the second pixel (pixel R, pixel G, and pixel B).

The imaging device 10 described with reference to FIG. 1 and the like is also one aspect of the present disclosure. The imaging device 10 includes the above-described imaging element 12 and a signal processing unit 13 that generates an image signal on the basis of a pixel signal on the basis of an electric signal obtained from the imaging element 12. Thus, as described above, the manufacturing cost can be reduced. The light receiving sensitivity can be improved or the aperture ratio can be increased.

REFERENCE SIGNS LIST

1 Object
10 Imaging device
11 Lens optical system
12, 100, 100A, 100B, 200 Imaging element
13 Signal processing unit
110 Pixel array
120 Optical element array
130 Pixel
150, 150A Transparent layer
160 Structure body
170 Filter layer
180 Wiring layer
190 Transparent substrate

The invention claimed is:

1. An optical element, comprising:
a transparent layer for covering a plurality of pixels each including a photoelectric conversion element; and
a plurality of structure bodies arranged on the transparent layer or in the transparent layer in a plane direction of the transparent layer, wherein
the plurality of structure bodies is arranged in such a manner that, among incident light, a first light having a wavelength in a near-infrared wavelength range is condensed on a first pixel among the plurality of pixels, and a second light of a second color having a wavelength outside the near-infrared wavelength range is condensed on a second pixel, and wherein the plurality of structure bodies is arranged to condense, onto a given pixel for a given color, a portion of the incident light having a wavelength range corresponding to the given color and incident on regions that face multiple pixels surrounding the given pixel.

2. The optical element according to claim 1, wherein
each of the plurality of structure bodies is a columnar structure body having a refractive index higher than a refractive index of the transparent layer and giving an optical phase delay amount according to a cross-sectional shape to the incident light, and
a cross-sectional shape of the plurality of structure bodies is set according to an optical phase delay amount distribution for achieving light condensation, and the plurality of structure bodies is arranged according to the optical phase delay amount distribution for achieving the light condensation.

3. The optical element according to claim 1, wherein a cross-sectional shape of each of the plurality of structure bodies is a four-fold rotationally symmetrical shape.

4. An imaging element, comprising:
the optical element according to claim 1; and
the plurality of pixels covered with the transparent layer.

5. The imaging element according to claim 4, further including a filter layer provided between the plurality of pixels and the transparent layer.

6. The imaging element according to claim 5, wherein the filter layer is a near-infrared absorption filter provided only on the second pixel.

7. An imaging device, comprising:
the imaging element according to claim 6; and
a signal processing unit configured to generate an image signal on a basis of an electric signal obtained from the imaging element.

8. An optical element, comprising:
a transparent layer for covering a plurality of pixels, each including a photoelectric conversion element; and
a plurality of structure bodies arranged on the transparent layer or in the transparent layer in a plane direction of the transparent layer, wherein
the plurality of structure bodies outputs a first light that has a wavelength in a near-infrared wavelength range among incident light, and outputs a second light of a second color having a wavelength outside the near-infrared wavelength range among the incident light, wherein the plurality of structure bodies is arranged to condense, onto a given pixel for a given color, a portion of the incident light having a wavelength range corresponding to the given color and incident on regions that face multiple pixels surrounding the given pixel.

\* \* \* \* \*